(12) United States Patent
Coon et al.

(10) Patent No.: US 10,884,344 B2
(45) Date of Patent: Jan. 5, 2021

(54) POSITIONING SYSTEM USING SURFACE PATTERN RECOGNITION AND INTERPOLATION

(71) Applicant: NIKON CORPORATION, Tokyo (JP)

(72) Inventors: Paul Derek Coon, Redwood City, CA (US); Jonathan K. Wells, San Francisco, CA (US); Matthew Rosa, Fremont, CA (US); Michael Binnard, Belmont, CA (US)

(73) Assignee: NIKON CORPORATION

(*) Notice: Subject to any disclaimer, the term of this patent is extended or adjusted under 35 U.S.C. 154(b) by 0 days.

(21) Appl. No.: 15/669,661

(22) Filed: Aug. 4, 2017

(65) Prior Publication Data

US 2017/0329236 A1 Nov. 16, 2017

Related U.S. Application Data

(63) Continuation of application No. 14/689,570, filed on Apr. 17, 2015, now Pat. No. 9,726,987.
(Continued)

(51) Int. Cl.
*G03F 7/20* (2006.01)
*G01D 5/347* (2006.01)
(Continued)

(52) U.S. Cl.
CPC ..... *G03F 7/70725* (2013.01); *G01D 5/34715* (2013.01); *G03F 7/70341* (2013.01);
(Continued)

(58) Field of Classification Search
CPC ........... G01D 5/34715; G03F 7/70341; G03F 7/70716; G03F 7/70725; G03F 7/70775;
(Continued)

(56) References Cited

U.S. PATENT DOCUMENTS 5,698,861 A * 12/1997 Oh .......................... A63H 18/16
250/206.1
5,925,956 A 7/1999 Ohzeki
(Continued)

OTHER PUBLICATIONS

Microsoft wireless laser mouse 7000 specifications: http://www.microsoft.com/hardware/en-us/d/wireless-laser-mouse-7000. The applicant admits that optical mice are prior art.
(Continued)

*Primary Examiner* — Tri T Ton
(74) *Attorney, Agent, or Firm* — Roeder & Broder LLP; Steven G. Roeder

(57) ABSTRACT

A stage assembly for positioning a device along a first axis, the stage assembly comprising: a base; a stage that retains the device and moves above the base; a mover assembly that moves the stage along the first axis relative to the base; a first sensor system that monitors the movement of the stage along the first axis, the first sensor system generating a first signal, the first sensor system having a first sensor accuracy; a second sensor system that monitors the movement of the stage along the first axis, the second sensor system having a second sensor accuracy that is different from the first sensor accuracy of the first sensor system, the second sensor generating a second signal; and a control system that controls the mover assembly using at least one of the first sensor and the second signal.

24 Claims, 11 Drawing Sheets

Related U.S. Application Data

(60) Provisional application No. 62/033,771, filed on Aug. 6, 2014, provisional application No. 61/980,920, filed on Apr. 17, 2014.

(51) Int. Cl.
*G03F 9/00* (2006.01)
*H02K 41/03* (2006.01)

(52) U.S. Cl.
CPC ...... *G03F 7/70716* (2013.01); *G03F 7/70775* (2013.01); *G03F 9/7026* (2013.01); *G03F 9/7034* (2013.01); *G03F 9/7049* (2013.01); *H02K 41/031* (2013.01); *H02K 2201/18* (2013.01)

(58) Field of Classification Search
CPC .... G03F 9/7026; G03F 9/7034; G03F 9/7049; H02K 2201/18; H02K 41/031; C07C 5/48; C07C 11/02; C07C 2521/04; C07C 2521/06; C07C 2523/14; C07C 2523/42; C07C 2523/62; C07C 2523/72; C07C 2523/89; A47L 13/20; B01J 23/626; B01J 23/8926; B01J 35/04; C07D 253/07; C07D 253/075

See application file for complete search history.

(56) References Cited

U.S. PATENT DOCUMENTS

| | | | |
|---|---|---|---|
| 6,094,269 A | 7/2000 | Ben-Dove et al. | |
| 6,249,591 B1* | 6/2001 | Tullis | G01D 5/305 382/106 |
| 6,570,104 B1 | 5/2003 | Ericson et al. | |
| 6,621,063 B2 | 9/2003 | McQueen | |
| 6,765,195 B1* | 7/2004 | Leviton | G01D 5/347 250/231.13 |
| 6,963,074 B2 | 11/2005 | McQueen | |
| 7,295,947 B2 | 11/2007 | Kurth et al. | |
| 7,617,070 B2 | 11/2009 | Kurth et al. | |
| 7,907,795 B2 | 3/2011 | Hardy et al. | |
| 7,999,841 B1* | 8/2011 | Stevens | H04N 5/2259 348/218.1 |
| 2002/0079466 A1* | 6/2002 | Talmi | G01D 5/347 250/559.1 |
| 2004/0130691 A1 | 7/2004 | Boonman et al. | |
| 2005/0211885 A1 | 9/2005 | Tobiason et al. | |
| 2006/0055912 A1* | 3/2006 | Kurth | G01C 19/28 356/28 |
| 2007/0229788 A1 | 10/2007 | Kosugi | |
| 2007/0246646 A1 | 10/2007 | Lum et al. | |
| 2009/0012743 A1 | 1/2009 | McDonnell | |
| 2010/0020180 A1 | 1/2010 | Hill et al. | |
| 2010/0157276 A1 | 6/2010 | Shibazaki | |
| 2011/0164238 A1 | 7/2011 | Yoshimoto | |
| 2011/0267594 A1 | 11/2011 | Kim et al. | |
| 2013/0141715 A1 | 6/2013 | Urano et al. | |
| 2014/0168625 A1 | 6/2014 | Ito | |
| 2014/0204358 A1 | 7/2014 | Yang et al. | |
| 2014/0232846 A1 | 8/2014 | Tanaka | |
| 2014/0368804 A1 | 12/2014 | LaFarre et al. | |
| 2015/0241525 A1 | 8/2015 | Yang et al. | |
| 2018/0217510 A1 | 8/2018 | Wells et al. | |

OTHER PUBLICATIONS

How do optical mice work?: http://computer.howstuffworks.com/question631.htm. The applicant admits that optical mice are prior art.

Office Action dated Oct. 23, 2018 by the U.S. Patent Office in U.S. Appl. No. 15/264,108.

* cited by examiner

A: Image at t=0ms

B: Image at t=0.67ms

POSITIONING SYSTEM USING SURFACE PATTERN RECOGNITION AND INTERPOLATION

RELATED APPLICATION

This application is a continuation application of U.S. application Ser. No. 14/689,570, filed on Apr. 17, 2015 and entitled "POSITIONING SYSTEM USING SURFACE PATTERN RECOGNITION AND INTERPOLATION". U.S. application Ser. No. 14/689,570 claims priority on U.S. Provisional Application Ser. No. 62/033,771 filed on Aug. 6, 2014, and entitled "POSITIONING SYSTEM USING SURFACE PATTERN RECOGNITION AND INTERPOLATION". U.S. application Ser. No. 14/689,570 also claims priority on U.S. Provisional Application Ser. No. 61/980,920 filed on Apr. 17, 2014, and entitled "OPTICAL SENSOR SYSTEM FOR SERVO CONTROL OF A MOVER". As far as permitted, the contents of U.S. application Ser. No. 14/689,570, U.S. Provisional Application Ser. Nos. 62/033,771 and 61/980,920 are incorporated herein by reference.

BACKGROUND

Exposure apparatuses are commonly used to transfer images from a reticle onto a semiconductor wafer during semiconductor processing. A typical exposure apparatus includes an illumination source, a reticle stage assembly that retains and positions a reticle, a lens assembly, a wafer stage assembly that retains and positions a semiconductor wafer, and a measurement system that monitors the position or movement of the reticle and the wafer.

One or both of the stage assemblies are often required to operate over a relatively large area. This can make the monitoring of the position and/or movement of the stage assembly difficult.

SUMMARY

The present invention is directed to a stage assembly for positioning a device along a first axis, the stage assembly comprising: a base; a stage that is adapted to retain the device and moves above the base; a mover assembly that moves the stage along the first axis relative to the base; a first sensor system that monitors the movement of the stage along the first axis, the first sensor system generating a first signal, the first sensor system having a first sensor accuracy; a second sensor system that monitors the movement of the stage along the first axis, the second sensor system having a second sensor accuracy that is different from the first sensor accuracy of the first sensor system, the second sensor generating a second signal; and a control system that controls the mover assembly using at least one of the first sensor and the second signal.

In one embodiment, the second sensor accuracy is greater than the first sensor accuracy. As alternative, non-exclusive examples, second sensor accuracy is at least approximately 10, 50, 100, 500, 1000, 1500 or 2000 times more accurate than the first sensor accuracy.

For example, the second sensor system can be an encoder system. Alternatively, the second sensor system can be an interferometer system. The first sensor system can include at least one optical sensor. Further, the first sensor system can capture a plurality of successive images and monitor the movement of the stage by comparing at least two images to generate the first signal.

In certain embodiments, the control system utilizes the second signal to calibrate the first signal. Additionally, or alternatively, the control system can use the first signal to control the mover during initialization and during a loss of the second signal. Additionally, or alternatively, the control system can use the first signal to control the mover during coarse movement of the stage.

In one embodiment, the mover assembly moves the stage along a second axis, along a third axis, and about the first, second and third axes relative to the stage base, and the first sensor system includes a plurality of spaced apart optical sensors that cooperate to monitor the movement of the stage along the first, second and third axes, and about the first, second and third axes. In this embodiment, each optical sensor can capture a plurality of successive images. In certain embodiments, the first axis is vertically oriented, and each image of the first sensor system can be analyzed to determine the movement of the stage along the first axis.

In another embodiment, the present invention is directed to a method for positioning a device along a first axis, the method comprising: providing a base; retaining the device with a stage; moving the stage along the first axis relative to the base with a mover assembly; monitoring the movement of the stage along the first axis with a first sensor that generates a first signal, the first sensor having a first sensor accuracy; monitoring the movement of the stage along the first axis with a second sensor system that generates a second signal, the second sensor having a second sensor accuracy that is different from the first sensor accuracy; and controlling the mover assembly with a control system that uses at least one of the first sensor and the second signal. Additionally, the invention is directed to a process for manufacturing a device that includes the step of positioning the device along the first axis.

The present invention is also directed to stage assembly for positioning a device along a first axis. In certain embodiments, the stage assembly comprises: (i) a stage that is adapted to retain the device, the stage including a first surface; (ii) a base including a second surface that faces the first surface of the stage; (iii) a first pattern that is provided on a target surface, wherein the target surface is one of the first surface and the second surface; (iv) a stage mover assembly that moves the stage along the first axis relative to the base; (v) a first sensor system that monitors the movement of the stage along the first axis, the first sensor system capturing a first image that captures at least a portion of the first pattern and a second image that captures at least a portion of the first pattern, the first sensor system monitoring the movement of the stage by comparing the first image and the second image to generate a first sensor signal; and (vi) a control system that controls the mover assembly using the first sensor signal. The first sensor signal can be derived by image analysis of the first and second images. In certain embodiments, the first axis is parallel to the target surface.

In some embodiments, the stage assembly must operate over large areas, but high precision placement is not necessary over the full range of travel. As provided herein, the problem of the limited speed, accuracy and resolution of a two-dimensional optical image position sensor is addressed by reducing the amount of work the system has to do, achieved by using a two-dimensional image profile sensor which reduces the number of data points from $N^2$ to $2N$, where N is the number of pixels in the image sensor. Additionally, the first sensor system also minimizes overlap needed between successive images (helped by the fact that the direction of travel is known); eliminates accumulation of position error from sample to sample; and allows recognition of a home position which enables absolute measurement.

In one embodiment, the first sensor system (i) sums a first intensity of light in each of a plurality of rows of pixels in the first image along the first axis to generate a first intensity signal, the plurality of rows of pixels in the first image being perpendicular to the first axis, and (ii) sums a second intensity of light in each of a plurality of rows of pixels in the second image along the first axis to generate a second intensity signal, the plurality of rows of pixels in the second image being perpendicular to the first axis. The first sensor system then compares the first intensity signal and the second intensity signal to generate the first sensor signal.

In certain embodiments, the first sensor system independently and simultaneously monitors the movement of the stage along the first axis and along a second axis that is orthogonal to the first axis. In such embodiments, the second axis can also be parallel to the target surface. In one such embodiment, the first sensor system (i) sums a first intensity of light in each of a plurality of rows of pixels in the first image along the first axis to generate a first intensity signal, (ii) sums a second intensity of light in each of a plurality of columns of pixels in the first image along the second axis to generate a second intensity signal, (iii) sums a third intensity of light in each of a plurality of rows of pixels in the second image along the first axis to generate a third intensity signal, and (iv) sums a fourth intensity of light in each of a plurality of columns of pixels in the second image along the second axis to generate a fourth intensity signal. The first sensor system then compares the first intensity signal and the third intensity signal to generate the first sensor signal that captures movement of the stage along the first axis, and compares the second intensity signal and the fourth intensity signal to generate a third sensor signal that captures movement of the stage along the second axis.

Additionally, in some embodiments, a second pattern is provided on the target surface. In such embodiments, the first image captures at least a portion of one of the first pattern and the second pattern, and the second image captures at least a portion of one of the first pattern and the second pattern. Further, a third pattern and a fourth pattern that can be provided on the target surface. In such embodiments, the first image captures at least a portion of one of the first pattern, the second pattern, the third pattern and the fourth pattern, and the second image captures at least a portion of one of the first pattern, the second pattern, the third pattern and the fourth pattern.

The stage assembly can further comprise a second sensor system that monitors the movement of the stage along the first axis, the second sensor system generating a second sensor signal. In such embodiments, the control system controls the mover assembly using at least one of the first sensor signal and the second sensor signal. In alternative embodiments, the second sensor system can be an interferometer system and/or an encoder system.

In one embodiment, the stage mover assembly can comprise at least one linear actuator. Additionally and/or alternatively, the stage mover assembly can comprise a planar motor that includes a magnet assembly that is secured to the stage, and a conductor assembly that is secured to the base.

The present invention is also directed to a stage assembly, an exposure apparatus, a device manufactured with the exposure apparatus, and/or a wafer on which an image has been formed by the exposure apparatus. Additionally, the present invention is further directed to a method for controlling and moving a stage, a method for making a stage assembly, a method for making an exposure apparatus, a method for making a device and a method for manufacturing a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
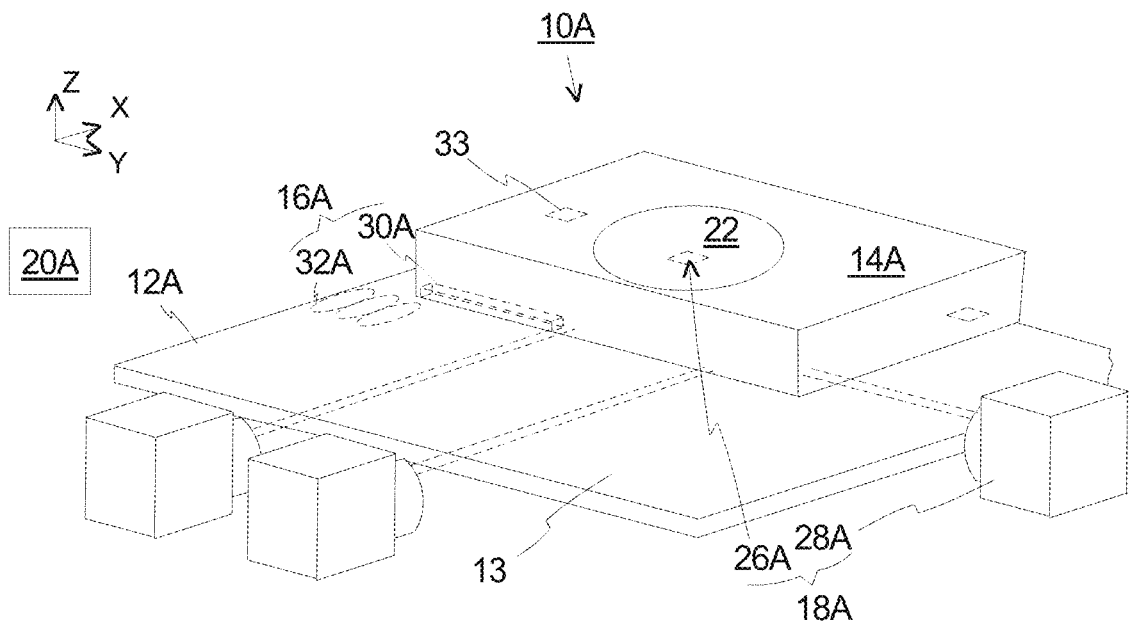
FIG. 1A is a simplified perspective view of a stage assembly having features of the present invention.

FIG. 1A is a simplified perspective illustration of a stage assembly 10A that includes a base 12A, a stage 14A, a stage mover assembly 16A (only a portion is illustrated in phantom), a measurement system 18A, and a control system 20A (illustrated as a box). The design of each of these components can be varied to suit the design requirements of the stage assembly 10A. The stage assembly 10A is particularly useful for precisely positioning a device 22 during a manufacturing and/or an inspection process. The type of device 22 positioned and moved by the stage assembly 10A can be varied. For example, the device 22 can be a semiconductor wafer, or a reticle, and the stage assembly 10A can be used as part of an exposure apparatus 924 (illustrated in FIG. 9) for precisely positioning the wafer or the reticle during manufacturing of the semiconductor wafer. Alternatively, for example, the stage assembly 10A can be used to move other types of devices during manufacturing and/or inspection, to move a device under an electron microscope (not shown), or to move a device during a precision measurement operation (not shown).

As an overview, in certain embodiments, the measurement system 18A utilizes both a first sensor system 26A (only a portion is illustrated in phantom), and a second sensor system 28A (only a portion is shown in the Figures) that cooperate to monitor the position of the stage 14A. The second sensor system 28A is of a different design and/or type than the first sensor system 26A. In certain embodiments, the first sensor system 26A has a first sensor accuracy that is less than a second sensor accuracy of the second sensor system 28A.

Further, in certain embodiments, the second sensor system 28A is used in the primary control of the stage mover assembly 16A. Further, in certain embodiments, the first sensor system 26A can be used during system initialization and/or when the signal from the second sensor system 28A is lost. Many times during initialization of the stage assembly 10A, the angle of the stage 14A is too much to get an accurate measurement with the second sensor system 28A. Further, water or other environmental factors can block the signal from the second sensor system 28A, or the stage 14A can be moved out of the range of the second sensor system 28A. At these times, the first sensor system 26A can be used to control the stage mover assembly 16A. Further, the first sensor system 26A can be used when less accuracy is required.

Additionally, in certain embodiments, the stage assembly 10A must operate over large areas, but high precision placement is not necessary over the full range of travel. As provided herein, the problem of positioning a stage 14A (e.g., a wafer stage) over a large area is solved by using (i) the first sensor system 26A to provide position/movement feedback used to control the stage mover assembly 16A in the regions where high precision is not necessary and/or where the second sensor system 28A may not be available, and (ii) the second sensor system 28A to provide position/movement feedback used to control the stage mover assembly 16A in the regions where high precision is necessary. As provided in the various embodiments illustrated and described herein, the first sensor system 26A provided herein is relatively inexpensive, capable of determining position to the micron level, and does not require extensive calibration. Further, in some embodiments, the first sensor system 26A can provide such advantages while also enabling advancements in tracking speed, accuracy and resolution, and while limiting processing time and complexity.

Moreover, in certain embodiments, the second sensor system 28A can be used to improve the accuracy of the first sensor system 26A. For example, the second sensor system 28A can be used to calibrate the first sensor system 26A.

Some of the Figures provided herein include an orientation system that designates an X axis, a Y axis that is orthogonal to the X axis, and a Z axis that is orthogonal to the X and Y axes. In these Figures, the Z axis is oriented in the vertical direction. It should be understood that the orientation system is merely for reference and can be varied. For example, the X axis can be switched with the Y axis and/or the stage assembly 10 can be rotated. Moreover, it should be noted that any of these axes can also be referred to as a first, a second, and/or a third axis.

In the embodiments illustrated herein, the stage assembly 10A includes a single stage 14A that retains the device 22. Alternatively, for example, the stage assembly 10A can be designed to include multiple stages that are independently moved and monitored with the measurement system 18A.

The base 12A is coupled to the stage mover assembly 16A, receives the reaction forces generated by the stage mover assembly 16A, and can be any suitable structure. In FIG. 1A, the base 12A is generally rectangular shaped and is rigid. In certain embodiments, the base 12A can be a reaction assembly that counteracts, reduces and minimizes the influence of the reaction forces from the stage mover assembly 16A on the position of other structures. For example, the base 12A can be a rigid, rectangular shaped countermass that is maintained above a countermass support (not shown) with a reaction bearing (not shown) that allows for motion of the base 12A relative to the countermass support along the X axis, along the Y axis and about the Z axis. For example, the reaction bearing can be a vacuum preload type fluid bearing, a magnetic type bearing, or a roller bearing type assembly. Alternatively, for example, the stage assembly 10A can include a reaction frame (not shown), that couples the stage mover assembly 16A to the base 12A or another structure.

With the present design, (i) movement of the stage 14A with the stage mover assembly 16A along the X axis, generates an equal and opposite X reaction force that moves the base 12A in the opposite direction along the X axis; (ii) movement of the stage 14A with the stage mover assembly 16A along the Y axis, generates an equal and opposite Y reaction force that moves the base 12A in the opposite direction along the Y axis; and (iii) movement of the stage 14A with the stage mover assembly 16A about the Z axis generates an equal and opposite theta Z reaction moment (torque) that moves the base 12A about the Z axis. Additionally, any motion of the stage 14A with respect to the base 12A when away from the center of mass of the base 12A will tend to produce a reaction moment in the Z direction on the base 12A that will tend to rotate the base 12A about the Z axis.

It should be noted that an upper surface 13 of the base 12A that faces the stage 14A can also be referred to as a "target surface". Alternatively, a bottom surface of the stage 14A that faces the upper surface 13 of the base 12A can be referred to and/or function as a "target surface".

The stage 14A retains the device 22. In one embodiment, the stage 14A is precisely moved by the stage mover assembly 16A to precisely position the stage 14A and the device 22. In FIG. 1A, the stage 14A is generally rectangular shaped and includes a device holder (not shown) for retaining the device 22. The device holder can be a vacuum chuck, an electrostatic chuck, or some other type of clamp.

The design of the stage mover assembly 16A can be varied to suit the movement requirements of the stage assembly 10. In the non-exclusive embodiment illustrated in FIG. 1A, the stage mover assembly 16A is a planar motor that moves the stage 14A along the X, Y, and Z axes, and about the X, Y, and Z axes (six degrees of freedom). In this embodiment, the first sensor system 26A monitors the movement or position of the stage 14A along the X, Y, and Z axes, and about the X, Y, and Z axes (six degrees of freedom); and the second sensor system 28A monitors the movement or position of the stage 14A along the X, Y, and Z axes, and about the X, Y, and Z axes (six degrees of freedom).

Alternatively, the stage mover assembly 16A can be designed to only move the stage 14A along the X and Y axes, and about Z axis (planar degrees of freedom). In this embodiment, the first sensor system 26A and the second sensor system 28A each monitor the movement of the stage 14A along the X and Y axes, and about Z axis.

In FIG. 1A, the stage mover assembly 16A is a planar motor that includes a magnet assembly 30A (only a portion is illustrated in phantom) that includes a plurality of spaced apart magnets (not shown), and a conductor assembly 32A (only a portion is illustrated in phantom) that includes a plurality of conductor units (not shown). Alternatively, for example, the stage mover assembly 16A can include one or more linear actuators, voice coil movers, or other types of actuators.

The measurement system 18A monitors the movement and/or the position of the stage 14A relative to a reference, such as an optical assembly 976 (illustrated in FIG. 9) of the exposure apparatus 924. With this information, the stage mover assembly 16A can be controlled by the control system 20A to precisely position the stage 14A. As provided herein, in certain embodiments, the measurement system 18A utilizes (i) the first sensor system 26A that monitors the movement and/or position of the stage 14A, and (ii) the second sensor system 28A that also monitors the movement and/or position of the stage 14A. The design of the measurement system 18A can be varied according to the movement requirements of the stage 14A.

The sensor systems 26A, 28A can vary. In the embodiment illustrated in FIG. 1A, the second sensor system 28A is an interferometer system. Further, in this embodiment, the first sensor system 26A includes a plurality of spaced apart image sensor assemblies 33 (illustrated as a box in phantom) that are fixedly attached to and/or integrated into the bottom of the stage 14A. With this design, the image sensor assemblies 33 with the stage 14A move relative to the base 12A. Alternatively, in one embodiment, if the target surface is included as the bottom surface of the stage 14A, the image sensor assemblies 33 can be fixedly attached to and/or integrated into the base 12A.

The number and design of the image sensor assemblies 33 can vary. For example, in FIG. 1A, each image sensor assembly 33 is able to monitor movement along at least the X and Y axes. Thus, three or more image sensor assemblies 33 may be needed to provide monitoring of the full movement of the stage 14A along the X, Y, and Z axes, and about the X, Y, and Z axes.

Further, if the first sensor system 26A only monitors movement of the stage 14A relative to the base 12A, another measurement system (not shown) may be necessary to monitor movement of the base 12A relative to the optical assembly 976 or another reference. However, in some embodiments, the first sensor system 26A itself can also be used to monitor movement of the base 12A relative to the optical assembly 976 or another reference. Further, the first sensor system 26A provided herein can be used in another type of stage assembly.

The control system 20A is electrically connected to the measurement system 18A, and utilizes the information from the first sensor system 26A and the second sensor system 28A to monitor and determine movement of the stage 14A. For example, the control system 20A can utilize the second sensor signals from the second sensor system 28A and/or the first sensor signals from the first sensor system 26A to monitor the movement of the stage 14A. The control system 20A is also electrically connected to, directs and controls electrical current to the stage mover assembly 16A to precisely position the device 22. With information regarding the movement or position of the stage 14A, the control system 20A can direct current to the stage mover assembly 16A so that the stage 14A follows a known, desired trajectory. The control system 20A can include one or more processors and is programmed to perform one or more of the steps provided herein.

Figure 1B:
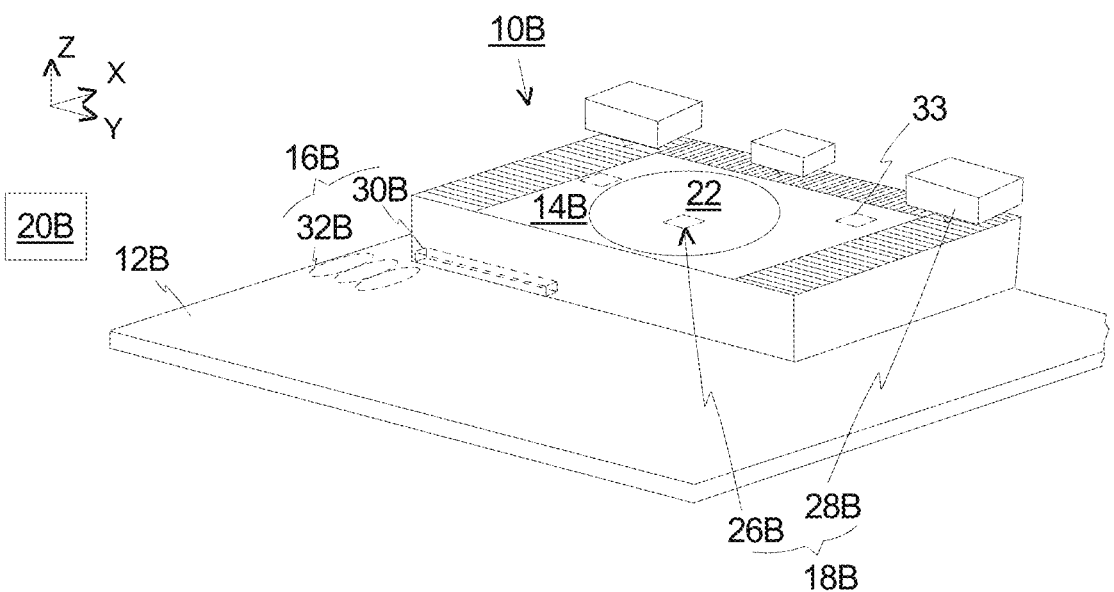
FIG. 1B is a simplified perspective view of another embodiment of a stage assembly having features of the present invention.

FIG. 1B is a simplified perspective view of another embodiment of a stage assembly 10B that includes a base 12B, a stage 14B, a stage mover assembly 16B including a magnet assembly 30B (only a portion is illustrated in phantom in FIG. 1B) and a conductor assembly 32B (only a portion is illustrated in phantom in FIG. 1B), and a control system 20B (illustrated as a box) that are similar to the corresponding components described above in reference to FIG. 1A. However, in this embodiment, the measurement system 18B is slightly different. More specifically, in this embodiment, the measurement system 18B again includes a first sensor system 26B including the plurality of image sensor assemblies 33 (only a portion is illustrated in phantom in FIG. 1B), and a second sensor system 28B (only a portion is illustrated in FIG. 1B). However, in this embodiment, the second sensor system 28B is an encoder assembly that includes one or more encoders that monitor the movement of the stage 12B along and about the first, second and third axes.

Figure 2A:
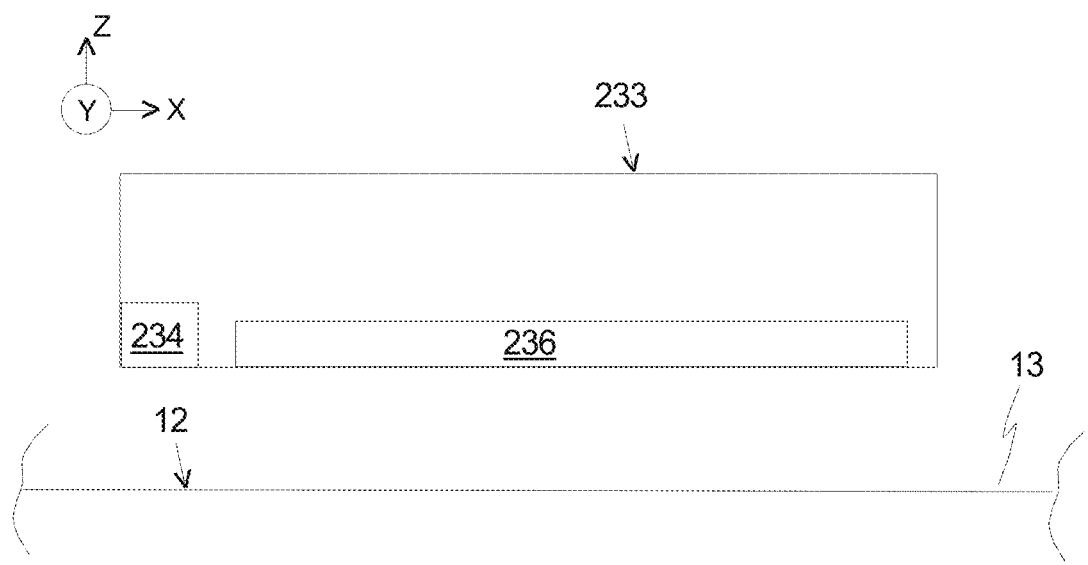
FIG. 2A is a simplified side view illustration of an image sensor assembly having features of the present invention and a portion of a stage assembly.

FIG. 2A is a simplified side view illustration of an image sensor assembly 233, and a portion of the base 12 including the target surface 13. In one embodiment, the image sensor assembly 233 includes a light source 234 (illustrated as a box), and an image sensor 236 (illustrated as a box) that is used to detect relative movement between the image sensor assembly 233 attached to the stage 14A (illustrated in FIG. 1A) and the target surface 13. The image sensor assembly 233 can also include an imaging lens (not shown) in the optical path before the image sensor 236.

In this embodiment, the light source 234 can be an LED, a laser, or another type of light source that illuminates the target surface 13.

Further, for example, the image sensor 236 can be an optoelectronic sensor (essentially, a tiny low-resolution video camera) that includes a two-dimensional array of pixels that records light electronically. With this design, the image sensor 236 captures successive, two-dimensional images of the target surface 13 as the stage 14A and the image sensor assembly 233 are moved relative to the target surface 13. Stated in another fashion, the image sensor assembly 233 captures multiple successive images at regular intervals (e.g., thousands of images per second). Depending on how fast the stage 14A is being moved, each image will be offset from the previous one by a fraction of a pixel or as many as several pixels. The control system 20A (illustrated in FIG. 1A) can process these images using cross correlation to calculate how much each successive image is offset from the previous one to determine the relative movement.

In one, non-exclusive embodiment, the image sensor assembly 233 has (i) a tracking speed=0.914 m/sec; (ii) an imaging rate=6000 frames per second; and (iii) a resolution=39.38 points per millimeter.

Figure 2B:
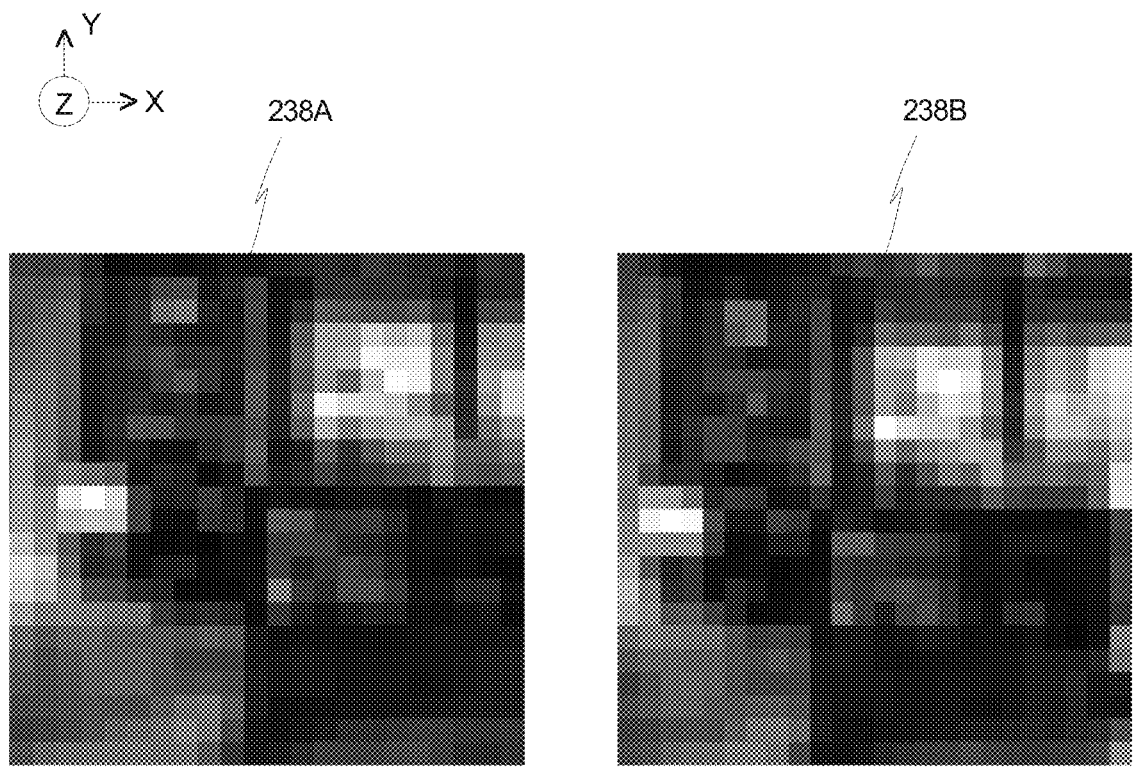
FIG. 2B illustrates a first image and a second image captured with an image sensor assembly such as illustrated in FIG. 2A.

FIG. 2B illustrates two images 238A, 238B captured by the image sensor assembly 233 (illustrated in FIG. 2A) at two different times. More specifically, FIG. 2B includes a first image 238A captured at time zero milliseconds (t=0 ms), and a second image 238B captured at a time that is 0.67 milliseconds later (t=0.67 ms). During this time interval, the stage 14A (illustrated in FIG. 1A) and the image sensor assembly 233 have moved relative to the target surface 13 (illustrated in FIG. 2A). As a result thereof, the second image 238B is similar, but slightly offset from the first image 238A. Thus, the two images 238A, 238B can be analyzed and the relative displacement of the stage 14A along the X and Y axes can be determined. Stated in another fashion, comparing images 238A and 238B, the amount of movement between the stage 14A and the target surface 13 along the X axis during this time interval is equal to the amount of offset between the images 238A, 238B along the X axis; and the amount of relative movement between the stage 14A and the target surface 13 along the Y axis during this time interval is equal to the amount of offset between the images 238A, 238B along the Y axis.

Figure 3A:
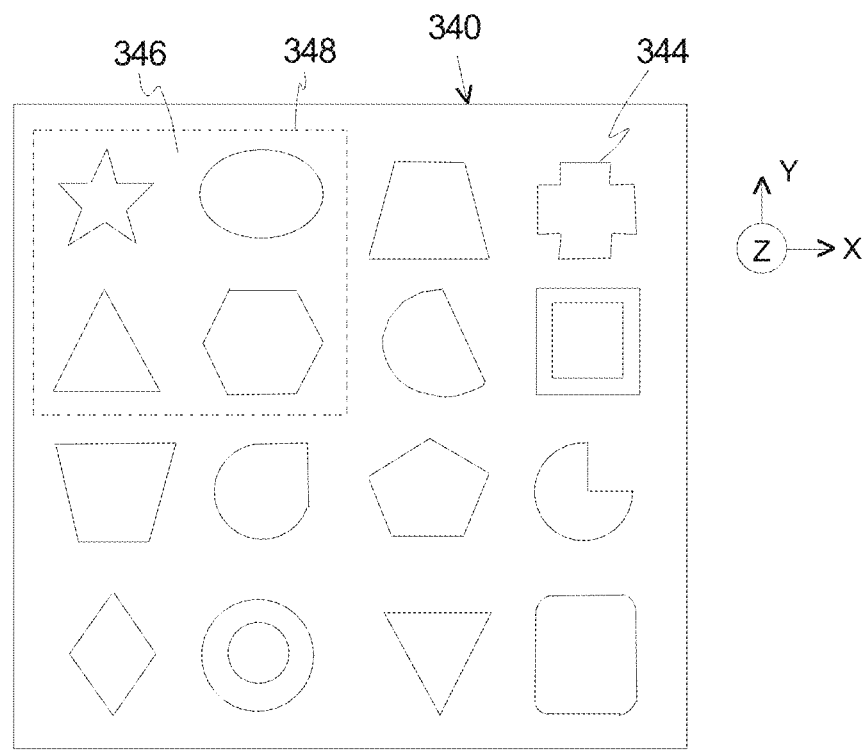
FIGS. 3A and 3B are simplified illustrations of alternative images captured with an image sensor assembly.
Figure 3B:
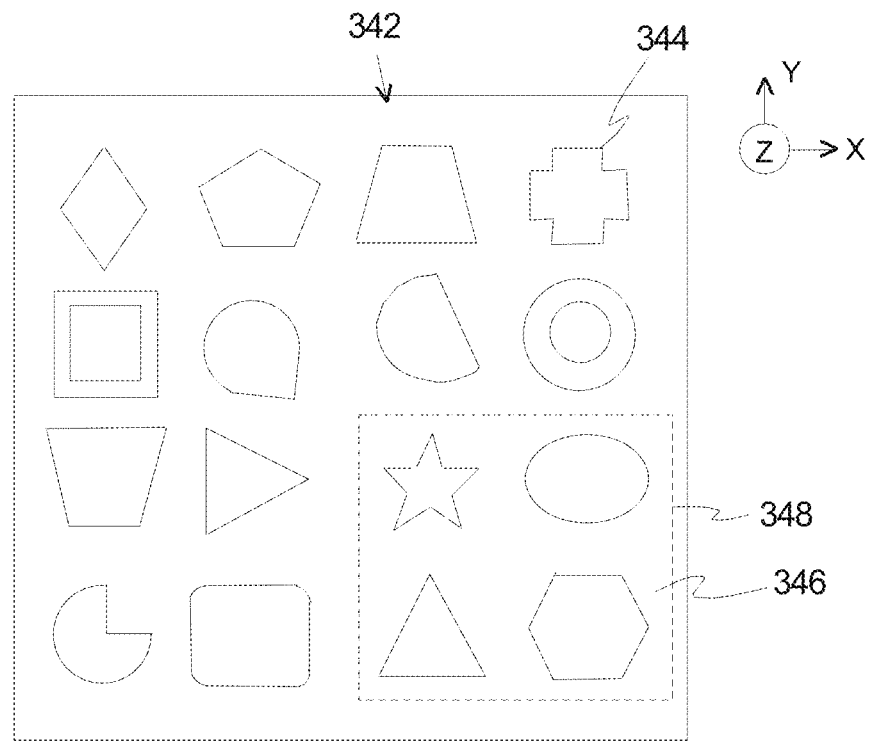

In certain embodiments, the target surface 13 is relatively large and has a lot of irregularities that can be captured with the images 238A, 238B and analyzed to determine relative movement. Alternatively, the target surface 13 can be modified and/or designed to include one or more features (e.g., characters) that can be organized in a pattern to speed up the analysis of the images, and increase the accuracy of the image sensor assembly 233. For example, FIGS. 3A and 3B illustrate two images 340, 342 of the target surface 13 captured at alternative times. These images 340, 342 illustrate the image of features 344 that exist on the target surface 13. These features 344 will allow the image sensor assembly 233 to periodically "reset" itself when it sees a pattern with a known location, and update the absolute location of the image sensor assembly 233.

The present invention also includes one or more additional methods for further improving the tracking speed and accuracy of the two-dimensional image sensor assembly 233.

For example, the measurement rate for such a two-dimensional image sensor assembly 233 can be improved by using dead-reckoning information to predict the expected image or otherwise reduce the detection or computational requirements of the image acquisition or processing. For example, for a lithography system, the control system 20A (illustrated in FIG. 1A) knows and controls the stage mover assembly 16A (illustrated in FIG. 1A) to move the stage 14A (illustrated in FIG. 1A) along a desired trajectory for the stage 14A. Thus, when the image sensor assembly 233 is used with photolithography equipment, to a very large extent, the control system 20A knows where the stage 14A is going at all times. This means that the control system 20A will have a very good idea of which two sections of the subsequent images 340, 342 will overlap.

Consider the images 340, 342 provided in FIGS. 3A and 3B. In this example, the overlapping area 346 is inside the dashed box 348 of FIGS. 3A and 3B. Because, the control system 20A knows the trajectory (because it is directing current to the mover assembly to move the stage along a trajectory), with the present invention, in certain embodiments, only dashed box 348 area of each of the images 340, 342 needs to be stored and processed in order to determine the relative displacement. This can be done, because it is known ahead of time that this is the only information that is important. This reduces computational overhead very significantly and allows the present image sensor assembly 233 to work faster. Because the image sensor assembly 233 can work faster, the information can be processed at a higher speed and this will allow for the maximum speed to be achieved by the stage assembly 10A (illustrated in FIG. 1A) while still being able to accurately track the movement of the stage 14A.

Thus, an advantage of this invention is that it allows the processing speed to increase, allowing for faster tracking of position in a lithography system.

In contrast, if the trajectory is not known, the entirety of each image can be stored and processed to determine the relative positioning (displacements) for each time step.

Figure 4:
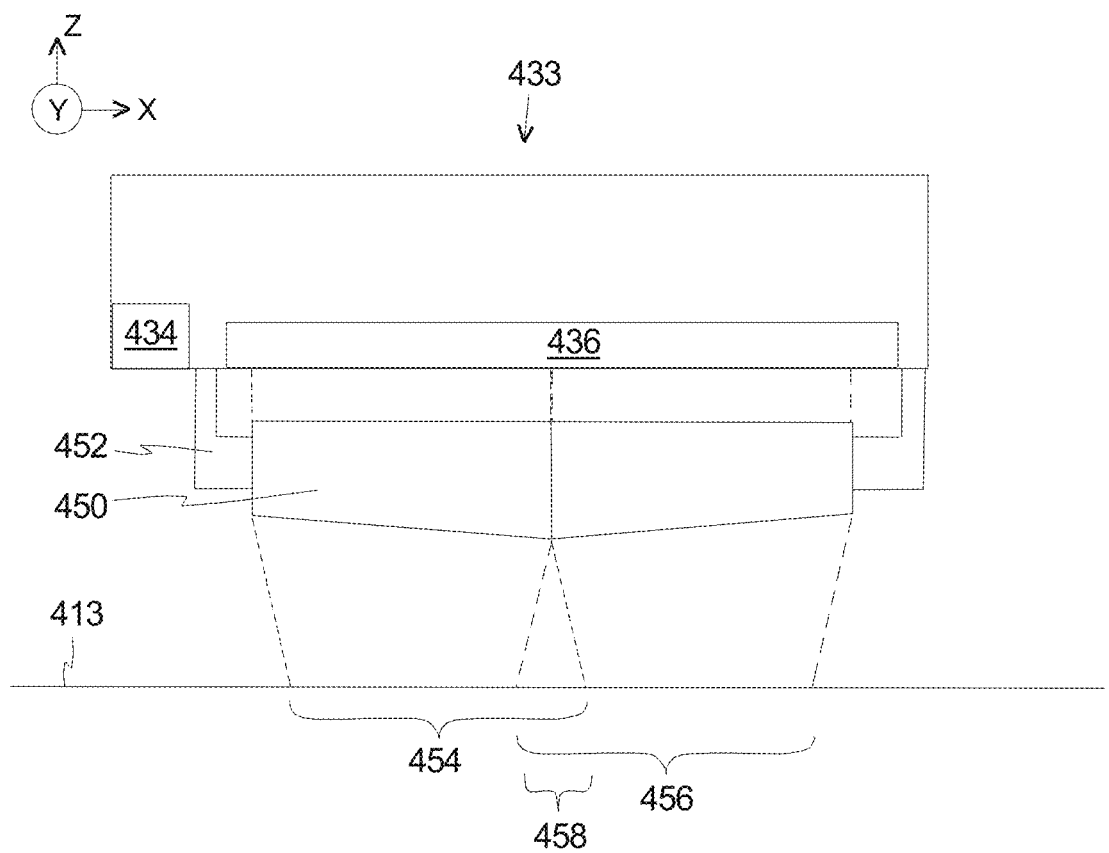
FIG. 4 is a simplified side view illustration of another embodiment of an image sensor assembly having features of the present invention and a portion of a stage assembly.

FIG. 4 is a simplified side view illustration of another embodiment of image sensor assembly 433 having features of the present invention and a target surface 413. In this embodiment, the image sensor assembly 433 includes a light source 434 and an image sensor 436 that are similar to the corresponding components described above. However, in this embodiment, the image sensor assembly 433 includes a prism 450 that is secured with a frame 452 to the rest of the image sensor assembly 433. In this embodiment, the prism 450 is positioned in the light path between the image sensor 436 and the target surface 413. Stated in another fashion, the prism 450 is inserted in the optical path in front of the image sensor 436.

In this embodiment, the problem of measuring Z height (the position along the vertical axis between the stage and the target surface 413) with the image sensor assembly 433 is solved by using the wedge shaped prism 450 to provide two partially overlapping images side by side on the image sensor 436 and computing the Z height by analyzing the amount of overlap between the two images.

More specifically, in FIG. 4, because of refraction through the prism 450, the imaging sensor 436 captures an image that includes a first area 454 of the target surface 413 (through the left part of the prism 450), and a second area 456 of the target surface 413 (through the right part of the prism 450) side by side. In this embodiment, the light captured from the first area 454 is illustrated with short dashes, while the light captured from the second area 456 is illustrated with long dashes. Further, because of the prism 450, the areas 454, 456 are partially overlapping 458. With this design, when the Z height between the image sensor assembly 433 and the target surface 413 changes, the amount of overlap 458 between the two images will change according to the angle of the chief rays below the prism 450. With this design, at a first Z height, there will be a first amount of overlap in the captured image; and at a second Z height, there will be a second amount of overlap that is different from the first Z height in the captured image. Generally speaking, as the Z height increases, the amount of overlap increases; and as the Z height decreases, the amount of overlap decreases. As part of the image processing algorithm, the system can determine the amount of image overlap in a single image and thereby derive the sensor Z height from the single image. Further, relative movement along the Z axis can be monitored by analyzing subsequent images.

Further, using this same image sensor assembly 433, the X and Y axes movement can be monitored by analyzing successive images as provided above. Thus, the image sensor assembly 433 illustrated in FIG. 4 is adapted to monitor movement along the X, Y, and Z axes (along three axes).

Referring back to FIG. 1A, in one non-exclusive embodiment, the stage 14A can initially be controlled in all six degrees of freedom using the signals from the first sensor system 26A. In this embodiment, the stage 14A is controlled using the first sensor system 26A to take off slowly with a Z trajectory motion. Next, the stage 14A is controlled to rotate about the X, Y and Z axes using the first sensor system 26A until a good signal is received by the second sensor system 28A. Subsequently, the second sensor system 28A is reset. Next, the signals from the second sensor system 28A are used to control the movement of the stage 14A with six degrees of freedom. During operation of the stage assembly 10A, the first sensor system 26A can be used to control the stage mover assembly 16A in the event the signal from the second sensor system 28A is lost.

Figure 5:
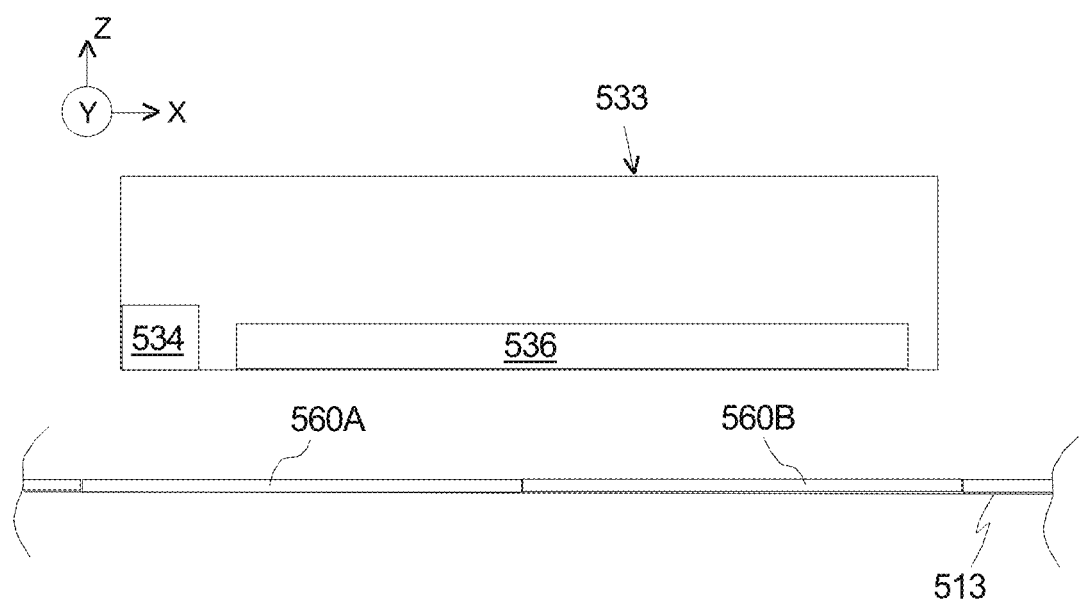
FIG. 5 is a simplified side view illustration of still another embodiment of an image sensor assembly having features of the present invention and a portion of a stage assembly.

FIG. 5 is a simplified side view illustration of still another embodiment of an image sensor assembly 533 having features of the present invention and a target surface 513. Additionally, as illustrated, one or more patterns, e.g., a first pattern 560A and a second pattern 560B, can be secured to, formed onto and/or formed into the target surface 513. In certain alternative embodiments, the one or more patterns 560A, 560B can be deliberately provided on the target surface 513 and/or the one or more patterns 560A, 560B can comprise random surface variations, so long as the one or more patterns 560A, 560B are known prior to use of the image sensor assembly 533.

The design of the image sensor assembly 533 can be varied. As illustrated in FIG. 5, in one embodiment, the image sensor assembly 533 can include a light source 534 (illustrated as a box), and an image sensor 536 (illustrated as a box), e.g., a camera, that is utilized to capture an image of the one or more patterns 560A, 560B that are secured to, formed onto and/or formed into the target surface 513. Additionally, by examining successive images captured with the image sensor 536, the image sensor assembly 533 is able to accurately detect relative and/or absolute movement between the image sensor assembly 533 attached to the stage 14A (illustrated in FIG. 1A) and the target surface 513. The image sensor assembly 533 can also include an imaging lens (not shown) in the optical path before the image sensor 536. Additionally and/or alternatively, the image sensor assembly 533 can be designed without the light source 534.

In certain embodiments, the light source 534 can be an LED, a laser, or another type of light source that illuminates the target surface 513. Further, in various applications, the light source 534 is used in a pulsed manner to inhibit image blur that may otherwise be present if utilizing a continuous light source.

Additionally, in one embodiment, the image sensor 536 comprises an image profile sensor that simply and quickly detects and sums the intensity of light within the image that extends in a single direction, i.e. along a single axis. More specifically, the image sensor 536 can individually and simultaneously detect and sum the intensity of light within the image in the X direction (i.e. along and/or parallel to the X axis) and in the Y direction (i.e. along and/or parallel to the Y axis). Thus, the design of the image sensor 536, as illustrated and described in FIG. 5, reduces the required number of data points to be captured and analyzed in comparison to a two-dimensional optical image position sensor. More specifically, with such design, the problem of the limited speed, accuracy and resolution of a two-dimensional optical image position sensor is addressed by reducing the amount of work the system has to do, achieved by using a two-dimensional image profile sensor which reduces the number of data points from $N^2$ to $2N$, where N is the number of pixels in the image sensor 536. Further, with this design, processing time is reduced not only by reducing the number of data points, but also by decoupling each of the axes, allowing processing algorithms to work in parallel on only one dimension, i.e. individually along one axis. Still further, such design effectively resets any position error that may be realized within any image sample, thereby eliminating any accumulation of position error from image sample to image sample that may otherwise be present in a two-dimensional optical image position sensor. More particularly, it is the addition of the one or more patterns 560A, 560B that inhibits any accumulation of position error.

As described in greater detail herein below, by capturing images that include all or portions of each of the one or more patterns 560A, 560B, which can be arranged in a specific known manner along the target surface 513, the image sensor assembly 533 is able to effectively identify the absolute position of the image sensor assembly 533 and thus the stage 14A relative to the target surface 513. This can be accomplished as the image sensor assembly 533 is able to identify a "home position" by effectively distinguishing between the one or more patterns that are present along the target surface 513. Additionally, this design also minimizes the amount of overlap that is needed between successive images for proper functionality, thereby further enabling an increased tracking speed. This aspect is additionally helped by the fact that it is known which way the image sensor assembly 533 and the stage 14A are travelling. Moreover, with this design, as the image sensor 536 is merely detecting the intensity of light in a given direction, there is no need for an arbitrary feature detection algorithm within the image processing for purposes of determining the distance travelled by the stage 14A as features are already known.

Figure 6A:
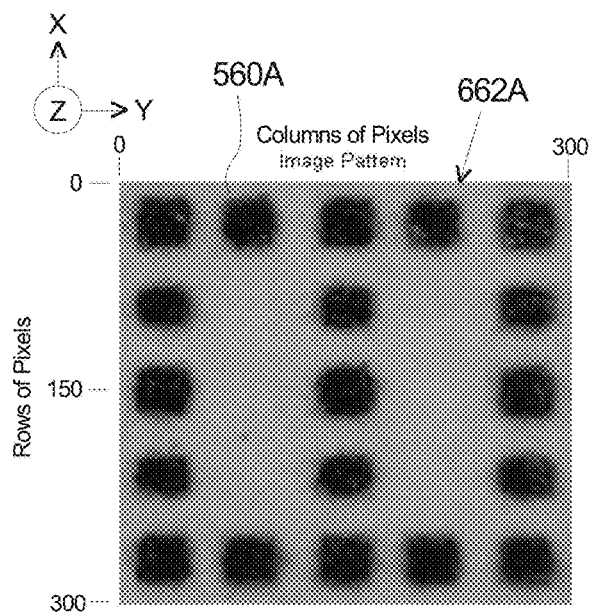
FIG. 6A illustrates a first image of a first pattern captured with the image sensor assembly illustrated in FIG. 5.

FIG. 6A illustrates a non-exclusive example of a first image 662A that comprises an image of a first pattern 560A that has been captured with the image sensor assembly 533 illustrated in FIG. 5. As shown in FIG. 6A, the first image 662A includes three hundred (300) rows of pixels that extend in the Y direction and three hundred (300) columns of pixels that extend in the X direction. Thus, the first image 662A includes ninety thousand pixels that are arranged in a 300 by 300 array. Alternatively, the first image 662A can include greater than or less than three hundred rows of pixels, greater than or less than three hundred columns of pixels, and/or greater than or less than ninety thousand total pixels that can be arranged in a different manner.

Designing a surface pattern that takes advantage of the way the image profile sensor 536 (illustrated in FIG. 5) works further enhances the performance of the overall image sensor assembly 533. For example, as illustrated in FIG. 6A, highly contrasting regions within the first pattern 560A provide excellent features for tracking and counting. By keeping track of how many peaks and valleys have crossed an arbitrary constant point on the image sensor 536, errors can be eliminated that may otherwise exist in a more conventional system. In FIG. 6A, the first pattern 560A includes a plurality of darkened squares that are positioned in a particular pattern along a lighter colored background.

Simultaneously, as noted above, processing time can be greatly reduced not only by reducing the number of data points that are required for proper and accurate analysis, but also by decoupling the axes, allowing the processing algorithms to individually work in parallel on each of the axes, i.e. individually on each of the X axis and the Y axis. Additionally, the surface pattern also eliminates the need for arbitrary image feature recognition in the processing algorithm, as the features of the patterns are already known.

It should be appreciated that the particular design of the one or more patterns, e.g., the first pattern 560A and the second pattern 560B (illustrated in FIG. 7A), can be varied as desired, so long as sufficiently highly contrasting regions exist within the patterns to enable easy and effective tracking and counting. For example, in one alternative pattern, the first pattern 560A can be rotated by ninety degrees to provide another suitable pattern for accurate detection. Additionally, it should be appreciated that further information can be encoded into the first pattern 560A by changing the relative height of the various peaks and valleys that can be found in the first pattern 560A.

Figure 6B:
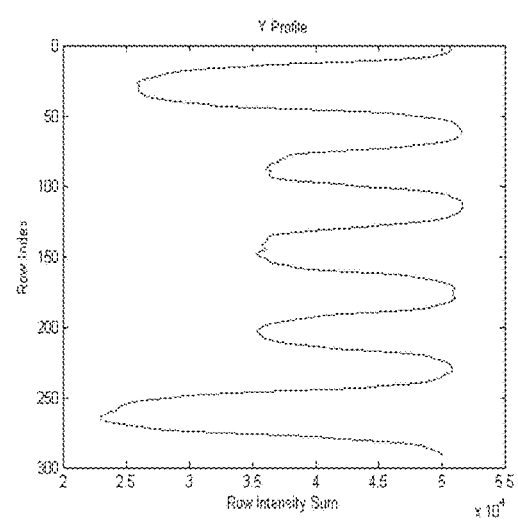
FIG. 6B is a graphical illustration of a measurement of the light intensity summed along a first axis in the first image of FIG. 6A.

FIG. 6B is a graphical illustration of a measurement of the light intensity summed along a first axis in the first image 662A of FIG. 6A. More particularly, FIG. 6B illustrates the light intensity sum for each row of pixels that extends from one side of the first image 662A to the other side of the first image 662A in the Y direction. As utilized herein, the light intensity sum for one or more of the rows of pixels can be referred to generally as a "light intensity signal".

As noted above, the first image 662A includes three hundred (300) rows of pixels that extend in the Y direction. For each row of pixels, the light intensity is detected, measured and/or summed in the Y direction, and is thus shown in the graph. As can be seen in FIG. 6B, in rows of pixels that do not include any portion of the darkened squares, the summed intensity of light is at or near a peak value. Conversely, in rows of pixels that do include any such darkened squares, the summed intensity of light is evidenced by the valleys illustrated in FIG. 6B, with the depth of the valley corresponding with the number of darkened squares within the row.

As shown in FIG. 6B, each of the peaks and valleys of the summed intensity of light has a somewhat rounded (i.e. non-squared) profile. This provides evidence that the darkened squares are not precisely consistent in light intensity as captured in the first image 662A. It should be appreciated that it is merely important that the overall pattern is easily recognizable and distinguishable, i.e. as a specific known pattern, in order to be able to effectively identify the position of the stage 14A and the image sensor assembly 533 relative to the target surface 513, based on the specific pattern that is identified on the target surface 513 substantially near and/or adjacent to the image sensor assembly 533.

Figure 6C:
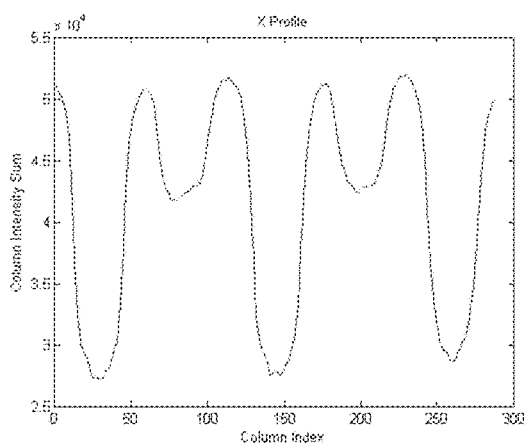
FIG. 6C is a graphical illustration of a measurement of the light intensity summed along a second axis in the first image of FIG. 6A.

FIG. 6C is a graphical illustration of a measurement of the light intensity summed along a second axis in the first image 662A of FIG. 6A. More particularly, FIG. 6C illustrates the light intensity sum for each column of pixels that extends from one side of the first image 662A to the other side of the first image 662A in the X direction. As utilized herein, the light intensity sum for one or more of the columns of pixels can be referred to generally as a "light intensity signal".

As noted above, the first image 662A includes three hundred (300) columns of pixels that extend in the X direction. For each column of pixels, the light intensity is detected, measured and/or summed in the X direction, and is thus shown in the graph. As can be seen in FIG. 6C, in columns of pixels that do not include any portion of the darkened squares, the summed intensity of light is at or near a peak value. Conversely, in columns of pixels that do include any such darkened squares, the summed intensity of light is evidenced by the valleys illustrated in FIG. 6C, with the depth of the valley corresponding with the number of darkened squares within the row. As further shown in FIG. 6C, each of the peaks and valleys of the summed intensity of light has a somewhat rounded (i.e. non-squared) profile for similar reasons as described above.

Figure 7A:
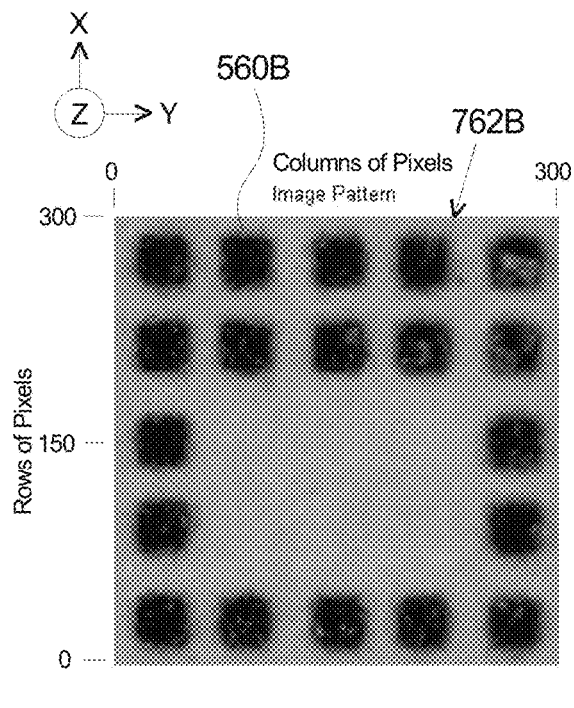
FIG. 7A illustrates a second image of a second pattern captured with the image sensor assembly illustrated in FIG. 5.

FIG. 7A illustrates a non-exclusive example of a second image 762B that comprises an image of a second pattern 560B that has been captured with the image sensor assembly 533 illustrated in FIG. 5. As shown in FIG. 7A, the second image 762B includes three hundred (300) rows of pixels that extend in the Y direction and three hundred (300) columns of pixels that extend in the X direction. Thus, the second image 762B includes ninety thousand pixels that are arranged in a 300 by 300 array. Alternatively, the second image 762B can include greater than or less than three hundred rows of pixels, greater than or less than three hundred columns of pixels, and/or greater than or less than ninety thousand total pixels that can be arranged in a different manner.

As illustrated in FIG. 7A, the second pattern 560B is slightly different than the first pattern 560A illustrated in FIG. 6A. By making this slight adjustment to the pattern, the second pattern 560B is again able to provide a unique readout that is easily detectable and distinguishable from the first pattern 560A and/or from any other patterns that may be utilized within the image sensor assembly 533. As illustrated in FIG. 7A, the second pattern 560B also includes highly contrasting regions that provide excellent features for tracking and counting. More particularly, in FIG. 7A, the second pattern 560B also includes a plurality of darkened squares that are positioned in a particular pattern along a lighter colored background, albeit in a slightly different pattern that is being utilized in the first pattern 560A. Additionally, by keeping track of how many peaks and valleys have crossed an arbitrary constant point on the image sensor 536 (illustrated in FIG. 5), errors can be eliminated that may otherwise exist in a more conventional system.

It should be appreciated that yet another alternative pattern can be designed simply by rotating the second pattern 560B.

Figure 7B:
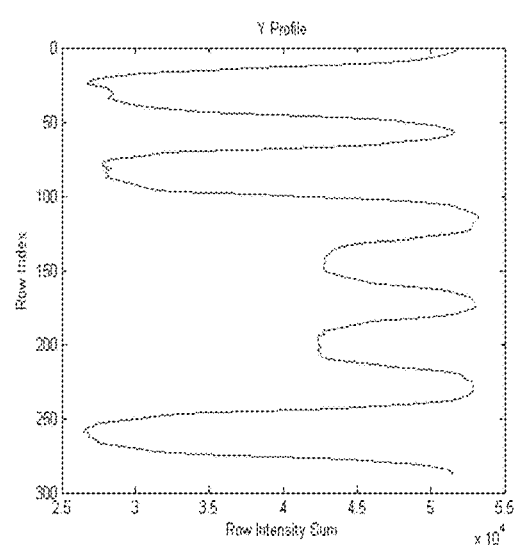
FIG. 7B is a graphical illustration of a measurement of the light intensity summed along a first axis in the first image of FIG. 7A.

FIG. 7B is a graphical illustration of a measurement of the light intensity summed along a first axis in the first image of FIG. 7A. More particularly, FIG. 7B illustrates the light intensity sum for each row of pixels that extends from one side of the second image 762B to the other side of the second image 762B in the Y direction.

As noted above, the second image 762B includes three hundred (300) rows of pixels that extend in the Y direction. For each row of pixels, the light intensity is detected, measured and/or summed in the Y direction, and is thus shown in the graph. As can be seen in FIG. 7B, in rows of pixels that do not include any portion of the darkened squares, the summed intensity of light is at or near a peak value. Conversely, in rows of pixels that do include any such darkened squares, the summed intensity of light is evidenced by the valleys illustrated in FIG. 7B, with the depth of the valley corresponding with the number of darkened squares within the row.

Figure 7C:
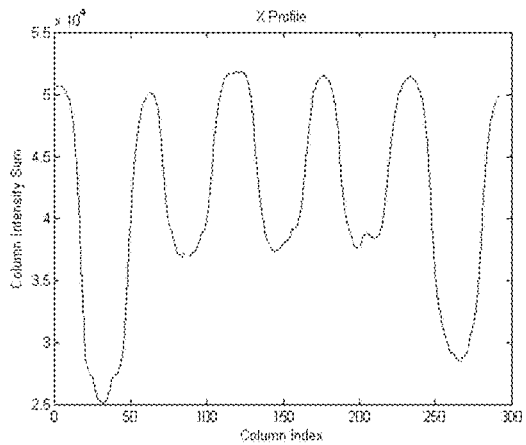
FIG. 7C is a graphical illustration of a measurement of the light intensity summed along a second axis in the first image of FIG. 6A.

FIG. 7C is a graphical illustration of a measurement of the light intensity summed along a second axis in the first image of FIG. 6A. More particularly, FIG. 7C illustrates the light intensity sum for each column of pixels that extends from one side of the second image 762B to the other side of the second image 762B in the X direction.

As noted above, the second image 762B includes three hundred (300) columns of pixels that extend in the X direction. For each column of pixels, the light intensity is detected, measured and/or summed in the X direction, and is thus shown in the graph. As can be seen in FIG. 7C, in columns of pixels that do not include any portion of the darkened squares, the summed intensity of light is at or near a peak value. Conversely, in columns of pixels that do include any such darkened squares, the summed intensity of light is evidenced by the valleys illustrated in FIG. 7C, with the depth of the valley corresponding with the number of darkened squares within the row.

Figure 8A:
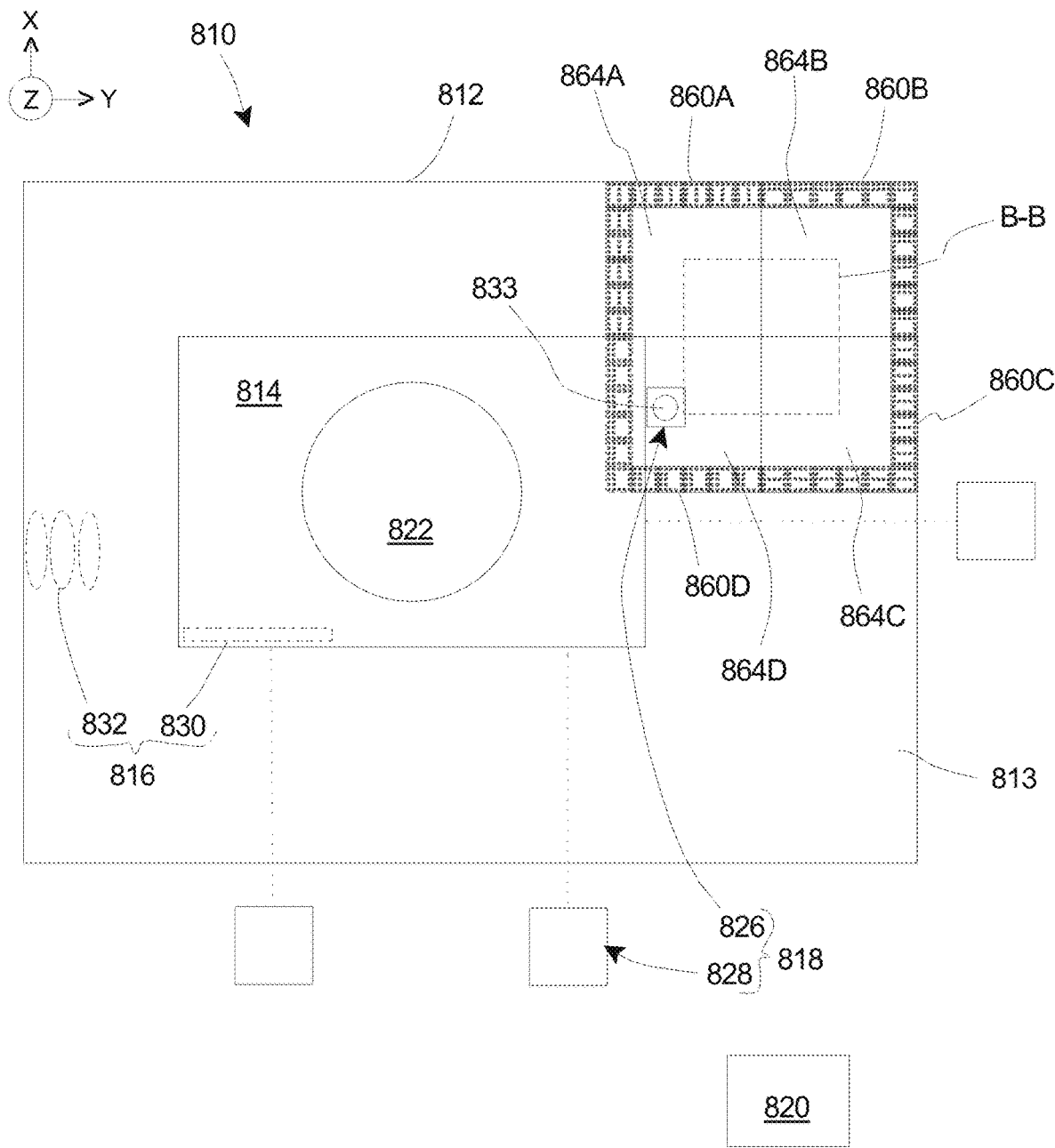
FIG. 8A is a simplified top view of still another embodiment of a stage assembly having features of the present invention.

FIG. 8A is a simplified top view of still another embodiment of a stage assembly 810 having features of the present invention. As illustrated, the stage assembly 810 is somewhat similar to the stage assembly 10A illustrated and described above in relation to FIG. 1A. For example, the stage assembly 810 can include a base 812 having a generally upward facing target surface 813, a stage 814 that retains a device 822, a stage mover assembly 816 including a magnet assembly 830 (only a portion is illustrated in phantom in FIG. 8A) and a conductor assembly 832 (only a portion is illustrated in phantom in FIG. 8A), and a control system 820 (illustrated as a box) that are similar to the corresponding components described above in reference to FIG. 1A. Additionally, the stage assembly 810 again includes a measurement system 818 having a first sensor system 826 and a second sensor system 828 that can monitor the movement and/or position of the stage 814 along the X, Y, and Z axes, and about the X, Y, and Z axes (six degrees of freedom).

However, in this embodiment, the first sensor system 826 is slightly different than in the previous embodiments. More specifically, as described in greater detail herein above, in this embodiment, the first sensor system 826 includes one or more image sensor assemblies 833 (only one is illustrated in FIG. 8A), with each image sensor assembly 833 including an image profile sensor 536 (illustrated in FIG. 5). As noted, the image profile sensor 536 is adapted to quickly and easily detect one or more patterns, e.g., a first pattern 860A, a second pattern 860B, a third pattern 860C and a fourth pattern 860D, that are secured to, formed onto and/or formed into the target surface 813 of the base 812. Only a portion of each pattern 860A-860D is illustrated in FIG. 8A for purposes of clarity.

In particular, the image profile sensor 536 is able to rapidly sum the intensity of light that is present in individual rows of pixels in the various patterns 860A-860D along a first axis, i.e. a Y axis, and in individual columns of pixels in the various patterns 860A-860D along a second axis, i.e. an X axis. With this design, the problem of limited speed, accuracy and resolution of a two-dimensional optical image position sensor (where each frame generates N^2 data points for transfer and analysis) can be addressed by reducing the amount of work the system has to do, which can be achieved by using a two-dimensional image profile sensor 536 that reduces the number of data points from N^2 to 2N, where N is the number of pixels in the image sensor 536. The ability to reduce the number of data points from N^2 to 2N enables larger view windows and shorter processing times, both of which increase the maximum tracking speed.

It should be appreciated that in other embodiments the number of different patterns that are secured to, formed onto and/or formed into the target surface 813 of the base 812 can be varied. More particularly, in certain alternative embodiments, the measurement system 818 can include greater than four or less than four different patterns that are secured to, formed onto and/or formed into the target surface 813 of the base 812. Additionally, as discussed herein, in some applications, the differing patterns are only deemed necessary in an effort to define a home position 866 (illustrated in FIG. 8B) that denotes an intersection of quadrants that each include different patterns. In areas where the target surface 813 includes patterns that may be positioned away from the home position 866, the target surface 813 need only include a single pattern.

As further illustrated in FIG. 8A, like patterns 860A-860D can be grouped together along at least a portion of the target surface 813 to form four quadrants, which can be utilized to identify a home position 866 (illustrated in FIG. 8B) for purposes of enabling absolute measurement of the position of the stage 814. Stated in another manner, a first quadrant 864A can include a plurality of first patterns 860A, a second quadrant 864B can include a plurality of second patterns 860B, a third quadrant 864C can include a plurality of third patterns 860C, and a fourth quadrant 864D can include a plurality of fourth patterns 860D.

Additionally, as illustrated, the one or more patterns 860A-860D need not be included along the entirety of the base 812. More specifically, in various applications, the one or more patterns 860A-860D are only included along areas of the target surface 813 where precision of stage movement is not as important, i.e. where the less precise first sensor system 826 is able to sufficiently monitor the movement and/or position of the stage 814. Conversely, in areas of the target surface 813 where greater precision is required, no patterns need be included as the second sensor system 828 is generally responsible for monitoring the movement and/or position of the stage 814 in such areas.

Figure 8B:
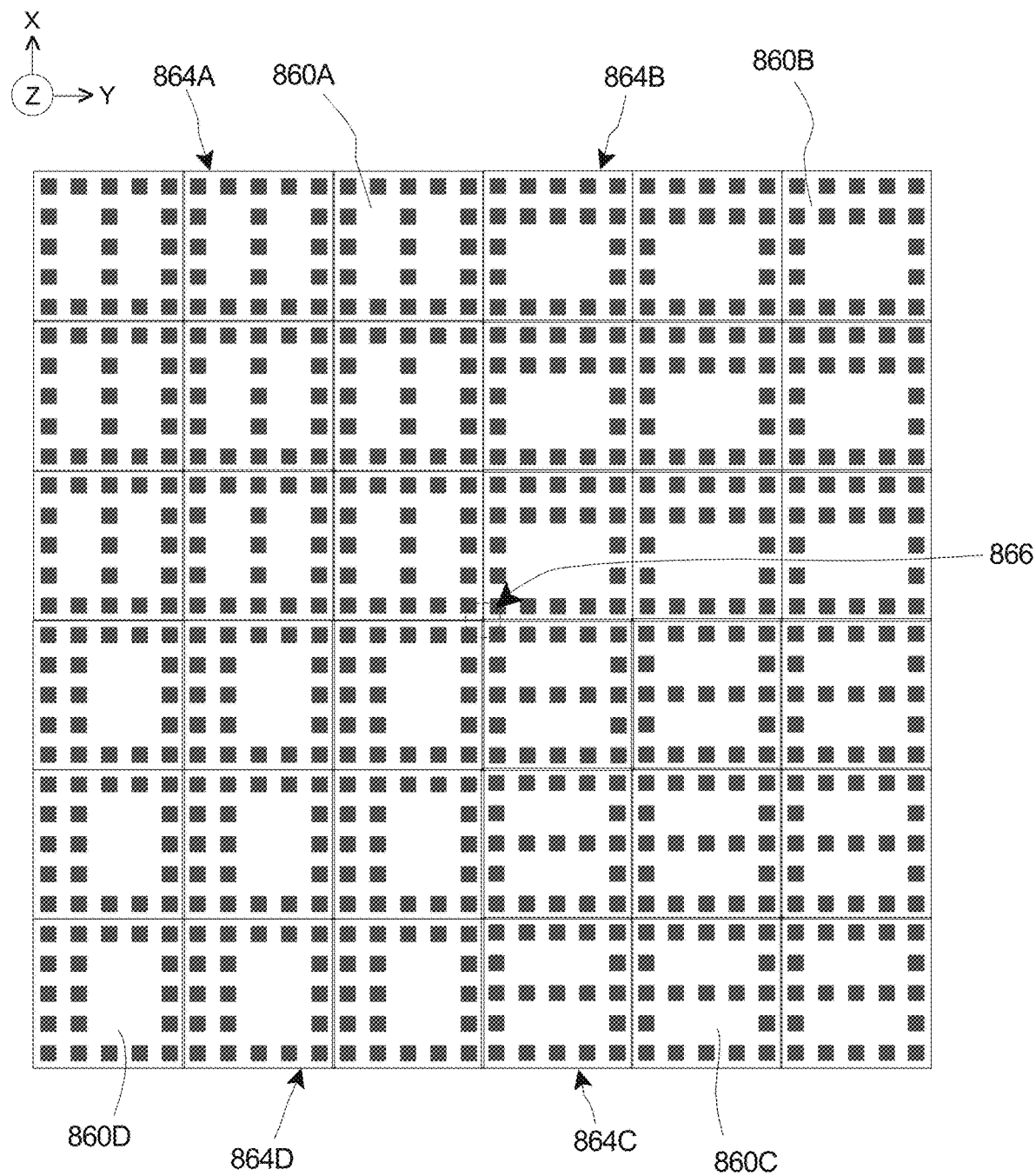
FIG. 8B is an enlarged view of a portion of the stage assembly illustrated in dashed box B-B in FIG. 8A.

FIG. 8B is an enlarged view of a portion of the stage assembly 810 illustrated in dashed box B-B in FIG. 8A. In particular, FIG. 8B illustrates each of the first pattern 860A, the second pattern 860B, the third pattern 860C and the fourth pattern 860D are secured to, formed onto and/or formed into the target surface 813 (illustrated in FIG. 8A) to be detected by the image sensor assembly 833 (illustrated in FIG. 8A). As noted, the patterns 860A-860D are secured to, formed onto and/or formed into the target surface 813 in the portion of the base 812 (illustrated in FIG. 8A) where lower precision is necessary for movement of the stage 814 (illustrated in FIG. 8A).

Additionally, as illustrated in this embodiment, like patterns 860A-860D can be grouped together to form the four quadrants. Stated in another manner, the first quadrant 864A can include a plurality of first patterns 860A, the second quadrant 864B can include a plurality of second patterns 860B, the third quadrant 864C can include a plurality of third patterns 860C, and the fourth quadrant 864D can include a plurality of fourth patterns 860D.

Moreover, as illustrated, the meeting point between each of the four quadrants 864A-864D can be utilized to define a home position 866 (illustrated by a dashed circle), which can be utilized to enable absolute measurement (as opposed to merely relative measurement) for the position of the stage 814 and the image sensor assembly 833 that is capturing an image of the home position 866. More specifically, as the image sensor assembly 833 captures images of one or more of the patterns 860A-860D that are secured to, formed onto and/or formed into the target surface 813, and by knowing the location of each of the patterns 860A-860D along the target surface 813, the image sensor assembly 833 is able to specifically identify which quadrant(s) 864A-864D the image sensor assembly 833 is adjacent to along the target surface 813. By identifying such quadrants 864A-864D, the control system 820 (illustrated in FIG. 8A) can control the stage mover assembly 816 (illustrated in FIG. 8A) to move in a certain direction, i.e. toward the quadrant(s) that are not identified in the captured images. Such process can be continued until each of the four quadrants 864A-864D, i.e. each of the four patterns 860A-860D, are identified in the captured image, at which point the home position 866 can be identified to enable such absolute measurement of the position of the stage 814. Stated in another manner, by leveraging this design strategy, it is possible to encode absolute position into the pattern from the home position 866.

Additionally, the periodicity of the patterns 860A-860D can be adjusted relative to the size of the image window, which can relax the amount of overlap needed between successive images. This means that the system is robust enough to handle larger motions and higher velocities between samples, which can be further helped by the fact that it is known in which direction the stage 814 is travelling.

In summary, by utilizing a measurement system 818 and/or a first sensor system 826 that utilizes and/or incorporates the various features as discussed in relation to FIGS. 5-8B, various advantages can be realized as demonstrated in increases in tracking speed, accuracy and resolution as compared to other systems. For example, the various advantages that can be realized with use of such measurement system 818 can include: (i) minimize overlap needed between successive images (helped by the fact that we know which direction we are travelling); (ii) eliminate accumulation of position error from sample to sample that is present in other systems (where each new frame becomes a reference for the following frame, thereby carrying over any error from one frame to the next, until the accumulated error can become very large); (iii) allows recognition of a home position which enables absolute measurement; (iv) eliminates need for an arbitrary feature detection algorithm in image processing; (v) eliminates the need for two-dimensional image processing algorithms; and (vi) reduces the number of data points in the positioning image from $N^2$ to $2N$ where N is the number of pixels on the image sensor, which in turn reduces time needed to transfer image data to processor and reduces time needed for image processing. Additionally, position resolutions much finer than the surface pattern are achievable through the pixel resolution on the image sensor, and even finer resolutions can be obtained through inter-pixel interpolation during image processing.

Figure 9:
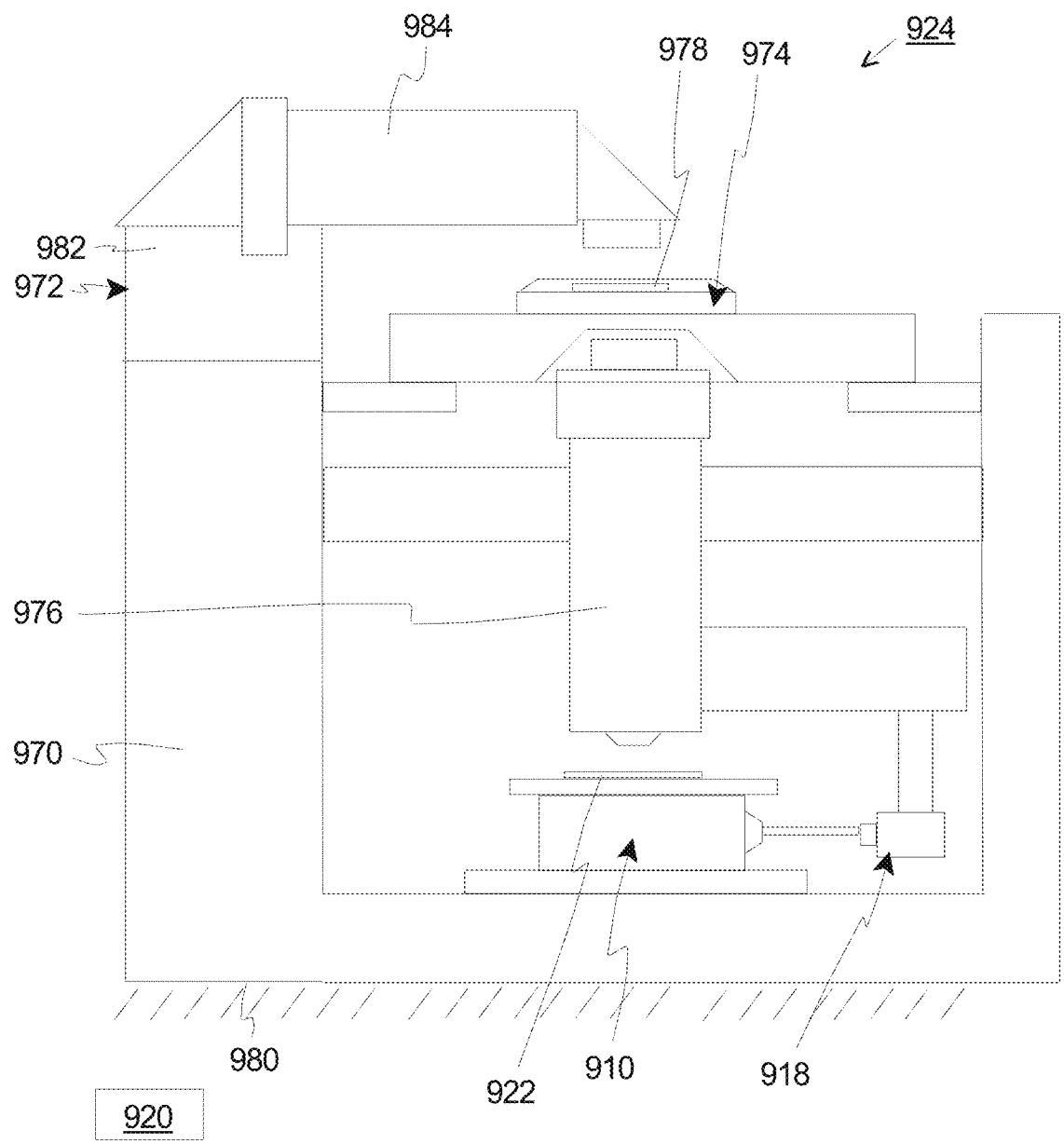
FIG. 9 is a schematic illustration of an exposure apparatus having features of the present invention.

FIG. 9 is a schematic view illustrating an exposure apparatus 924 useful with the present invention. The exposure apparatus 924 includes an apparatus frame 970, a measurement system 918 (only a portion is illustrated in FIG. 9), an illumination system 972 (irradiation apparatus), a reticle stage assembly 974, an optical assembly 976 (lens assembly), a wafer stage assembly 910, and a control system 920 that controls the reticle stage assembly 974 and the wafer stage assembly 910. The stage assemblies provided herein above can be used as the wafer stage assembly 910. Alternatively, with the disclosure provided herein, the stage assemblies provided herein above can be modified for use as the reticle stage assembly 974.

The exposure apparatus 924 is particularly useful as a lithographic device that transfers a pattern (not shown) of an integrated circuit from a reticle 978 onto a semiconductor wafer 922. The exposure apparatus 924 mounts to a mounting base 980, e.g., the ground, a base, or floor or some other supporting structure.

The apparatus frame 970 is rigid and supports the components of the exposure apparatus 924. The design of the apparatus frame 970 can be varied to suit the design requirements for the rest of the exposure apparatus 924.

The illumination system 972 includes an illumination source 982 and an illumination optical assembly 984. The illumination source 982 emits a beam (irradiation) of light energy. The illumination optical assembly 984 guides the beam of light energy from the illumination source 982 to the reticle 978. The beam illuminates selectively different portions of the reticle 978 and exposes the semiconductor wafer 922.

The optical assembly 976 projects and/or focuses the light passing through the reticle 978 to the wafer 922. Depending upon the design of the exposure apparatus 924, the optical assembly 976 can magnify or reduce the image illuminated on the reticle 978.

The reticle stage assembly 974 holds and positions the reticle 978 relative to the optical assembly 976 and the wafer 922. Similarly, the wafer stage assembly 910 holds and positions the wafer 922 with respect to the projected image of the illuminated portions of the reticle 978.

There are a number of different types of lithographic devices. For example, the exposure apparatus 924 can be used as a scanning type photolithography system that exposes the pattern from the reticle 978 onto the wafer 922 with the reticle 978 and the wafer 922 moving synchronously. Alternatively, the exposure apparatus 924 can be a step-and-repeat type photolithography system that exposes the reticle 978 while the reticle 978 and the wafer 922 are stationary.

However, the use of the exposure apparatus 924 and the stage assemblies provided herein are not limited to a photolithography system for semiconductor manufacturing. The exposure apparatus 924, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

It should be noted that the design of the measurement system can be varied pursuant to the teachings provided herein. For example, the image sensor assemblies could be positioned in such a way as to measure X or Y axes movement, while other sensors are used to measure Z axis movement.

Additionally, the same principle of locating the stage with respect to a stage base, countermass, or with respect to a reference frame using image sensor assemblies can be implemented on a moving coil stage as well (in the above embodiments, only a moving magnet stage is illustrated in the Figures).

A photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 10A:
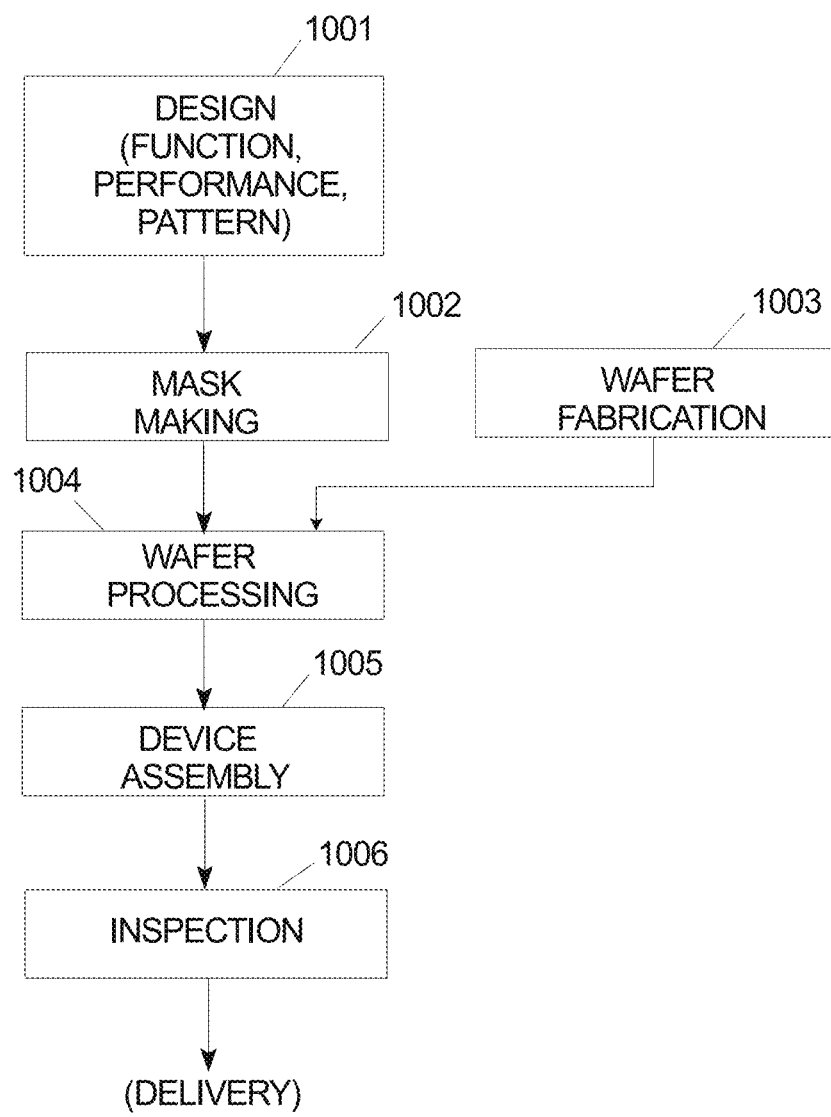
FIG. 10A is a flow chart that outlines a process for manufacturing a device in accordance with the present invention.

Further, semiconductor devices can be fabricated using the above described systems, by the process shown generally in FIG. 10A. In step 1001 the device's function and performance characteristics are designed. Next, in step 1002, a mask (reticle) having a pattern is designed according to the previous designing step, and in a parallel step 1003 a wafer is made from a silicon material. The mask pattern designed in step 1002 is exposed onto the wafer from step 1003 in step 1004 by a photolithography system described hereinabove in accordance with the present invention. In step 1005 the semiconductor device is assembled (including the dicing process, bonding process and packaging process), finally, the device is then inspected in step 1006.

Figure 10B:
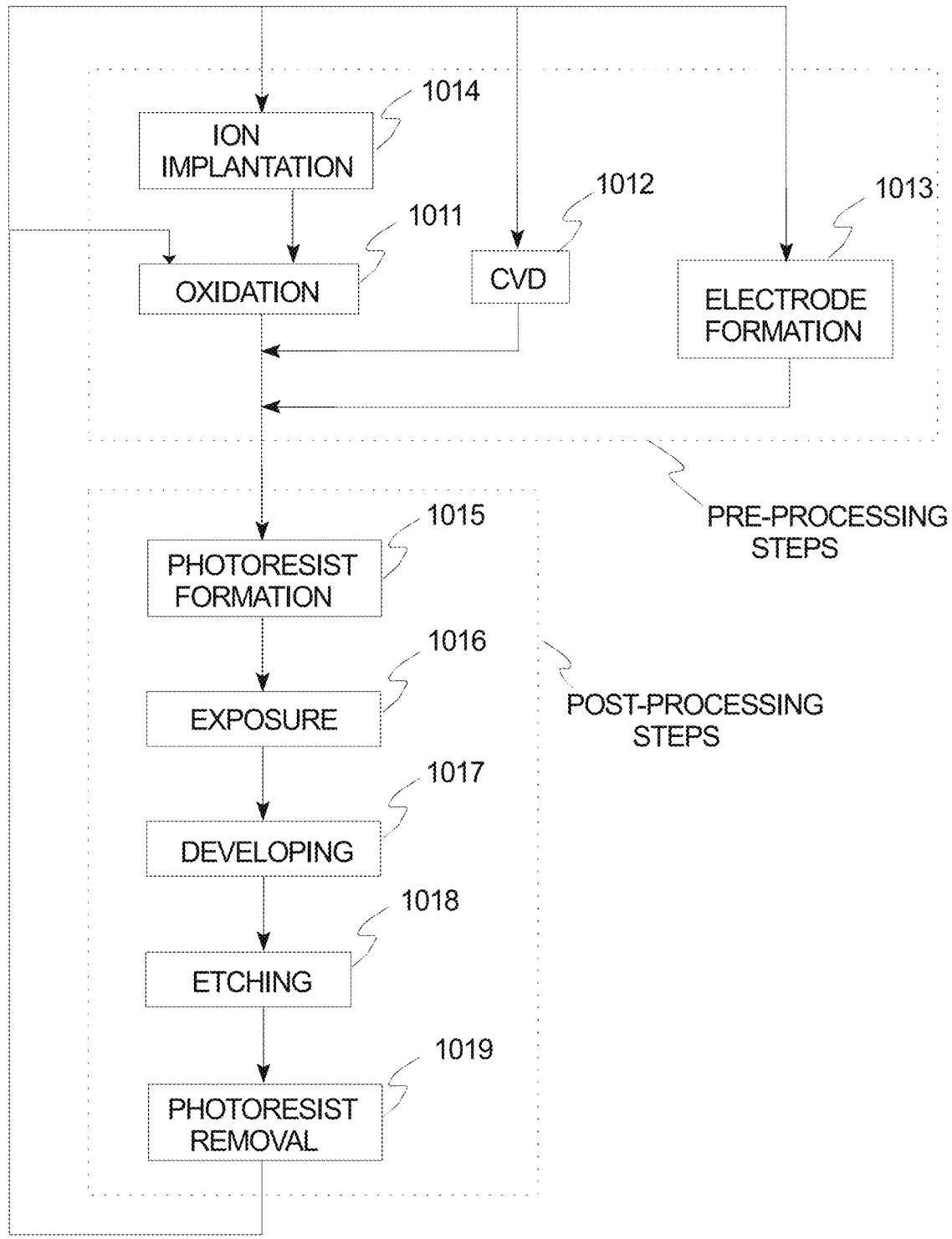
FIG. 10B is a flow chart that outlines device processing in more detail.

FIG. 10B illustrates a detailed flowchart example of the above-mentioned step 1004 in the case of fabricating semiconductor devices. In FIG. 10B, in step 1011 (oxidation step), the wafer surface is oxidized. In step 1012 (CVD step), an insulation film is formed on the wafer surface. In step 1013 (electrode formation step), electrodes are formed on the wafer by vapor deposition. In step 1014 (ion implantation step), ions are implanted in the wafer. The above mentioned steps 1011-1014 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 1015 (photoresist formation step), photoresist is applied to a wafer. Next, in step 1016 (exposure step), the above-mentioned exposure device is used to transfer the circuit pattern of a mask (reticle) to a wafer. Then in step 1017 (developing step), the exposed wafer is developed, and in step 1018 (etching step), parts other than residual photoresist (exposed material surface) are removed by etching. In step 1019 (photoresist removal step), unnecessary photoresist remaining after etching is removed.

Multiple circuit patterns are formed by repetition of these preprocessing and post-processing steps.

It is understood that although a number of different embodiments of the stage assembly 10A, the measurement system 18A and the first sensor system 26A have been illustrated and described herein, one or more features of any one embodiment can be combined with one or more features of one or more of the other embodiments, provided that such combination satisfies the intent of the present invention.

While a number of exemplary aspects and embodiments of a stage assembly 10A, a measurement system 18A and a first sensor system 26A have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. An assembly for controlling relative movement between a first object and a second object, the assembly comprising:
   a sensor system that is secured to the first object, the sensor system including a plurality of spaced apart optical sensors each of which includes an array of pixels, each optical sensor capturing a plurality of successive images of the second object and generating a sensor signal based on at least two of the images;
   a mover assembly that moves one of the first object and the second object along a first axis, along a second axis, and along a third axis; and
   a control system that controls a position of one of the objects using the sensor signal;
   wherein the plurality of spaced apart optical sensors cooperate to monitor the relative movement between the first object and the second object along the first axis, the second axis, and the third axis.

2. The assembly of claim 1 wherein the second object includes a target surface, and further comprising a pattern that is at least one of formed on and secured to the target surface; and wherein the sensor system captures information for a first image that includes at least a portion of the pattern and captures information for a second image that includes at least a portion of the pattern, the sensor system monitoring the relative movement between the first object and the second object by comparing the first image and the second image to generate the sensor signal.

3. The assembly of claim 2 wherein the sensor system further includes a light source that illuminates the target surface.

4. The assembly of claim 2 wherein the sensor system (i) sums a first intensity of light in each of a plurality of rows of pixels in the first image to generate a first intensity signal, the plurality of rows of pixels in the first image being perpendicular to a first axis, and (ii) sums a second intensity of light in each of a plurality of rows of pixels in the second image to generate a second intensity signal, the plurality of rows of pixels in the second image being perpendicular to the first axis.

5. The assembly of claim 4 wherein the sensor system compares the first intensity signal and the second intensity signal to generate the sensor signal.

6. The assembly of claim 1 wherein the second object includes a target surface, and further comprising a first pattern and a second pattern that are at least one of formed on and secured to the target surface; and wherein the sensor system captures information for a first image that includes at least a portion of one of the first pattern and the second pattern, and captures information for a second image that includes at least a portion of one of the first pattern and the second pattern.

7. The assembly of claim 1 wherein the mover assembly further moves the one of the first object and the second object about the first, second and third axes, and wherein the plurality of spaced apart optical sensors further cooperate to monitor the relative movement between the first object and the second object about the first, second and third axes.

8. An assembly for controlling a position of an object relative to a target surface, the assembly comprising:
   a pattern that is at least one of formed on and secured to the target surface;
   a sensor system that is secured to the object and monitors the position of the object, the sensor system including a plurality of spaced apart optical sensors each of which includes an array of pixels, each optical sensor capturing information for a first image that includes at least a portion of the pattern; and
   a control system that analyzes the first image to determine the position of the object relative to the target surface;
   wherein the sensor system (i) sums a first intensity of light in each of a plurality of rows of pixels in the first image to generate a first intensity signal, the plurality of rows of pixels in the first image being perpendicular to a first axis, and (ii) sums a second intensity of light in each of a plurality of rows of pixels in the second image to generate a second intensity signal, the plurality of rows of pixels in the second image being perpendicular to the first axis.

9. The assembly of claim 8 wherein the sensor system further captures information for a second image that includes at least a portion of the pattern, the sensor system monitoring the position of the object by comparing the first image and the second image to generate a sensor signal.

10. The assembly of claim 9 wherein the control system controls the position of the object using the sensor signal.

11. The assembly of claim 8 wherein the sensor system compares the first intensity signal and the second intensity signal to generate the sensor signal.

12. The assembly of claim 8 wherein the sensor system further includes a light source that illuminates the target surface.

13. The assembly of claim 8 further comprising a mover assembly that moves the object.

14. An assembly for monitoring movement of a first object relative to a second object, the second object including a target surface, the assembly comprising:
   at least one optical sensor that is secured to the first object, the at least one optical sensor including an array of pixels, the at least one optical sensor capturing a plurality of successive images of the second object, the at least one optical sensor capturing information for a first image that includes at least a portion of the target surface and capturing information for a second image that includes at least a portion of the target surface, and the at least one optical sensor monitoring the relative movement between the first object and the second object by comparing the first image and the second image to generate a sensor signal; and
   a control system that controls the position of one of the objects using the sensor signal;
   wherein the at least one optical sensor (i) sums a first intensity of light in each of a plurality of rows of pixels in the first image to generate a first intensity signal, the plurality of rows of pixels in the first image being perpendicular to a first axis, and (ii) sums a second intensity of light in each of a plurality of rows of pixels in the second image to generate a second intensity signal, the plurality of rows of pixels in the second image being perpendicular to the first axis.

15. The assembly of claim 1 wherein each optical sensor generates the sensor signal based on an amount of offset between the at least two of the images.

16. An assembly for controlling relative movement between a first object and a second object, the assembly comprising:
   a sensor system that is secured to the first object, the sensor system including an optical sensor that captures a plurality of images of a surface of the second object, the surface facing toward the first object; and
   a control system that determines a distance between the first object and the second object along a first axis that is oriented in a direction that is orthogonal to the surface, the control system analyzing an amount of overlap in at least one of the images captured by the optical sensor along a second axis that is at an angle relative to the first axis to determine the distance between the first object and the second object along the first axis.

17. The assembly of claim 16 wherein the second axis is orthogonal to the first axis.

18. The assembly of claim 16 wherein the sensor system includes a plurality of spaced apart optical sensors, and wherein a chief ray of one of the optical sensors is not parallel to a chief ray of the other of the optical sensors.

19. An assembly for controlling relative movement between a first object and a second object, the assembly comprising:
   a sensor system that is secured to the first object, the sensor system including a plurality of spaced apart optical sensors, each optical sensor capturing a plurality of images of the second object, and
   a control system that determines relative position between the first object and the second object along a first axis;
   wherein a chief ray of one of the optical sensors is not parallel to a chief ray of the other of the optical sensors; and
   wherein the sensor system further includes an optical component which changes an angle of the chief ray of the one of the optical sensors to be not parallel to the chief ray of the other of the optical sensors.

20. The assembly of claim 16 wherein the control system calculates the distance between the first object and the second object by using the plurality of images captured by the optical sensor.

21. The assembly of claim 16 wherein the control system analyzes the amount of overlap in only a single image captured by the optical sensor to determine the distance along the first axis between the first object and the second object based on the amount of overlap.

22. The assembly of claim 16 wherein the optical sensor generates a sensor signal based on an amount of offset between at least two of the images.

23. The assembly of claim 16 wherein the optical sensor captures an image including a first area and a second area that overlaps with the first area; and wherein the control system analyzes overlap between the first area and the second area in the image, and determines the distance between the first object and the second object based on the overlap in the image.

24. The assembly of claim 16 wherein the sensor system includes a prism positioned between the optical sensor and the second object, the prism causing the first area and the second area of the image to overlap in the image.

\* \* \* \* \*